(12) United States Patent
Fan

(10) Patent No.: US 7,964,929 B2
(45) Date of Patent: Jun. 21, 2011

(54) METHOD AND APPARATUS PROVIDING IMAGER PIXELS WITH SHARED PIXEL COMPONENTS

(75) Inventor: Xiaofeng Fan, Boise, ID (US)

(73) Assignee: Aptina Imaging Corporation, George Town (KY)

( * ) Notice: Subject to any disclaimer, the term of this patent is extended or adjusted under 35 U.S.C. 154(b) by 797 days.

(21) Appl. No.: 11/892,516

(22) Filed: Aug. 23, 2007

(65) Prior Publication Data

US 2009/0053848 A1 Feb. 26, 2009

(51) Int. Cl.
*H01L 27/146* (2006.01)
(52) U.S. Cl. .............. 257/443; 257/291; 257/E27.131; 438/59; 438/199; 348/308
(58) Field of Classification Search .............. 257/88, 257/202, 258, 291, 443, E31.083, E27.131, 257/E27.132, E27.152; 438/59, 199; 348/308
See application file for complete search history.

(56) References Cited

U.S. PATENT DOCUMENTS

| | | | |
|---|---|---|---|
| 6,043,478 A | 3/2000 | Wang | |
| 6,054,746 A | 4/2000 | Bird et al. | |
| 6,140,630 A | 10/2000 | Rhodes | |
| 6,204,524 B1 | 3/2001 | Rhodes | |
| 6,243,134 B1 * | 6/2001 | Beiley | 348/308 |
| 6,310,366 B1 | 10/2001 | Rhodes et al. | |
| 6,326,652 B1 | 12/2001 | Rhodes | |
| 6,333,205 B1 | 12/2001 | Rhodes | |
| 6,376,868 B1 | 4/2002 | Rhodes | |
| 6,657,665 B1 * | 12/2003 | Guidash | 348/308 |
| RE38,499 E | 4/2004 | Merrill et al. | |
| 6,838,653 B2 | 1/2005 | Campbell et al. | |
| 7,057,150 B2 | 6/2006 | Zarnowski et al. | |
| 7,193,258 B2 | 3/2007 | Hara et al. | |
| 2002/0008767 A1 | 1/2002 | Lee | |
| 2003/0184666 A1 * | 10/2003 | Jo | 348/308 |
| 2004/0069930 A1 | 4/2004 | Zarnowski et al. | |
| 2005/0051808 A1 | 3/2005 | Hynecek | |
| 2005/0128327 A1 | 6/2005 | Bencuya et al. | |
| 2005/0185077 A1 | 8/2005 | Xiao | |
| 2005/0196889 A1 * | 9/2005 | Lee | 438/48 |
| 2006/0027843 A1 | 2/2006 | Ogura et al. | |
| 2006/0255381 A1 | 11/2006 | McKee | |
| 2006/0256221 A1 | 11/2006 | McKee et al. | |
| 2006/0267052 A1 | 11/2006 | McKee | |
| 2007/0034884 A1 | 2/2007 | McKee | |
| 2007/0040922 A1 | 2/2007 | McKee et al. | |
| 2007/0058062 A1 | 3/2007 | Ohta | |
| 2007/0063127 A1 | 3/2007 | Bock | |
| 2009/0135284 A1 * | 5/2009 | Altice et al. | 348/308 |

FOREIGN PATENT DOCUMENTS

EP 1 017 106 A2 7/2000

(Continued)

OTHER PUBLICATIONS

Takahashi, H. et al., "A 3.9-/spl mu/m pixel pitch VGA format 10-b digital output CMOS image sensor with 1.5 transistor/pixel;" I.E.E.E., Dec. 2004, 38(12), pp. 2417-2425.

(Continued)

*Primary Examiner* — Matthew C Landau
*Assistant Examiner* — Colleen E Snow

(57) ABSTRACT

The disclosed embodiments employ shared pixel component architectures that arrange the shared pixel components for a group of pixels within different pixels of the group.

17 Claims, 20 Drawing Sheets

FOREIGN PATENT DOCUMENTS

| | | |
|---|---|---|
| JP | 2006-054276 | 2/2006 |
| KR | 2004-0092809 | 11/2004 |
| WO | WO/2007/024561 | 3/2007 |
| WO | WO/2007/027728 | 3/2007 |

OTHER PUBLICATIONS

Abe, H., "Device technologies for high quality and smaller pixel in CCD and CMOS image sensors;" Semicond. Solutions Network Co., Sony Corp., Kanagawa, Japan; Electron Devices Meeting, 2004; IEDM Technical Digest, IEEE Intl., Dec. 13-15, 2004, pp. 989-992.

Moon, Chang-Rok et al., "The features and characteristics of 5M CMOS image sensor with 1.9/spl times/1.9/spl mu/m/sup 2/ pixels;" Technol. Dev. Team, Samsung Electron. Co., Ltd., Gyeonggi, So. Korea; Electron Devices Meeting, 2005; IEDM Technical Digest, IEEE Intl., Dec. 5-7, 2005.

* cited by examiner

US 7,964,929 B2

METHOD AND APPARATUS PROVIDING IMAGER PIXELS WITH SHARED PIXEL COMPONENTS

FIELD OF THE INVENTION

Embodiments of the present invention relate generally to digital imagers and in particular to shared pixel component architectures.

BACKGROUND OF THE INVENTION

Typically, a CMOS imager array includes a focal plane array of pixels, each one of the pixels including a photosensor, e.g., a photogate, photoconductor, or photodiode. The photosensor converts photons to electrons, which are typically transferred to a floating diffusion region connected to the gate of a source follower transistor. In addition to the photosensor, floating diffusion region, and source follower transistor, a pixel typically includes a charge transfer transistor for transferring charge from the photosensor to the floating diffusion region, a reset transistor for resetting the floating diffusion region to a predetermined charge level prior to photocharge transference, and a row select transistor for gating the output of the source follower transistor as a pixel output voltage.

CMOS imager circuits, processing steps thereof, and detailed descriptions of the functions of their various CMOS elements are described, for example, in U.S. Pat. No. 6,140, 630, U.S. Pat. No. 6,376,868, U.S. Pat. No. 6,310,366, U.S. Pat. No. 6,326,652, U.S. Pat. No. 6,204,524, U.S. Pat. No. 6,333,205, U.S. Pub. No. 2006/0256221, and U.S. Pub. No. 2006/0255381, each assigned to Micron Technology, Inc., and hereby incorporated by reference in their entirety.

FIGS. 1A-C respectively illustrate a top-down view layout (sometimes hereinafter referred "layout"), a cross-sectional view (taken along 1-1' of FIG. 1A), and a circuit schematic of a four transistor (4T) CMOS pixel 100 employing a photodiode as the photosensor 101. When incident light 187 strikes the photosensor 101, electron/hole pairs are generated within the substrate in the vicinity of the p-n junction of the photodiode (represented at the boundary of n-accumulation region 122 and p+ surface layer 123). The photocharges (electrons) are collected in the n-type accumulation region 122 of the photosensor 101 during a charge integration period. After the integration period ends, the generated photocharges are transferred from the charge accumulation region 122 to the floating diffusion region 110 via a charge transfer transistor 106. The amount of charge at the floating diffusion region 110 drives the connected gate 108' of the source follower transistor 108 to thereby produce a corresponding pixel output voltage VOUT, which is subsequently output on a column output line 111 via the row select transistor 109.

CMOS imager designs, such as that shown in FIGS. 1A-C for pixel 100, provide approximately a fifty percent fill factor, meaning only about half of the pixel 100 area is utilized in converting light to charge carriers. The remainder of the pixel 100 is allocated to the floating diffusion region 110, the charge transfer gate 106' of the charge transfer transistor 106, as well as the source/drain regions 115 of the reset 107, source follower 108, and row select 109 transistors and their respective gates 107'-109'.

FIGS. 2A-B disclose a shared pixel component architecture which reduces the number of pixel components per each pixel to thereby increase the fill factor of each pixel, as well. As shown by the top-down view layout and circuit diagram of FIGS. 2A-B, two adjacent pixels 412-413 within a pixel group 450 each have respective photosensors 401A-B and charge transfer gates 406A'-B' (as part of respective charge transfer transistors 406A-B), but the remaining pixel components 407-410 are shared between the adjacent pixels 412-413. These shared pixel components 407-410 are arranged as a shared trunk 490, which is located between two adjacent photosensors in a next pixel column.

The shared pixel components 407-410 include a common floating diffusion region 410, a reset transistor 407, a source follower transistor 408, a row select transistor 409 and their respective gates 407'-409'. The reset transistor 407 gates the supply voltage VAA-PIX to reset the floating diffusion node 410. The source follower transistor 408 receives the supply voltage VAA-PIX to generate the pixel output voltage VOUT based on the amount of charge stored by the floating diffusion node 410. The row select transistor 409 selectively reads out the pixel output voltage VOUT from the source follower transistor 408 to a column line 411.

Each pixel provides two signals as VOUT, a reset signal Vrst when the floating diffusion node is reset, and a photosignal Vsig when charge is transferred to the floating diffusion node 410 from a photosensor 401A-B. The floating diffusion node 410 is also driven to a reset potential, via the reset transistor 407, before photocharge transference. The potential of the reset floating diffusion node 410 is used to generate a corresponding pixel output voltage, which is sampled and held as a reset voltage Vrst by a sample and hold circuit 265 (FIG. 10). Thereafter, the amount of photocharge generated by the respective photosensor 401A-B is used to generate another corresponding pixel output voltage Vsig. The corresponding pixel output voltage VOUT is sampled and held as a signal voltage Vsig by the sample and hold circuit 265. A differential amplifier 267 subsequently generates a differential signal (Vsig−Vrst) from the photosignal Vsig and reset Vrst voltages. The differential signal (Vsig−Vrst), which indicates the pixel value of the pixel 412, compensates for common noise.

The pixels 412-413 alternate use of the shared pixel components 407-410. In particular, the pixels 412-413 are arranged on the same pixel column and operated in accordance with a rolling shutter, such as illustrated by FIG. 3. As shown, the rolling shutter utilizes at least two pointers, Reset and Read, which move down the pixel array 450 on a row-by-row basis. The Reset pointer resets and starts integration for all pixels of its presently designated row. The Read pointer subsequently reaches the same row and initiates signal readout of those pixels. A rolling shutter is one method of controlling the use of shared pixel components 407-410. Those of ordinary skill in the art will appreciate that other methods are available. They will also appreciate that the pixels 412-413 need not be arranged in the same column nor adjacent to one another in order to exercise such control.

The shared pixel component architecture of FIG. 2A, as well as other shared pixel component architectures, have some shortcomings. First, the layouts of the pixels 412-413 are not uniform because the respective charge transfer gates 406A'-B', for example, have different locations (e.g., locations within their respective pixels 412-413) and different orientations (e.g., form different angles with a column-wise or row-wise direction of the pixels 412-413) to accommodate the grouped arrangement of the shared pixel components 407-410. In other words, the layouts of the pixels 412-413 are varied to direct their respective charge transfer gates 406A'-B' toward the shared trunk 490. Such a lack of uniformity can increase the complexity of pixel array manufacture and decrease the consistency in pixel performance. Second, the number of pixels 412-413 cannot be increased or decreased without redesigning the layouts of the pixels 412-413 and their shared pixel components 407-410.

DETAILED DESCRIPTION OF THE INVENTION

In the following detailed description, reference is made to the accompanying drawings, which form a part hereof and show by way of illustration specific embodiments in which the invention may be practiced. These embodiments are described in sufficient detail to enable those skilled in the art to practice them, and it is to be understood that other embodiments may be utilized, and that structural, logical, and electrical changes may be made.

The term "pixel" refers to a photo-element unit containing a photoconversion device and associated transistors for converting electromagnetic radiation to an electrical signal. The pixels discussed herein are illustrated and described as 4T (4 transistor) pixel circuits comprising charge transfer, reset, source follower, and row select transistors or 3T (3 transistor) pixel circuits comprising charge transfer, reset, and source follower transistors. It should be understood that the embodiments are not limited to use with 4T and 3T pixel circuits, but may be used with other pixel circuit arrangements. In addition, although the embodiments are described with reference to a pixel for a CMOS imager, they have applicability to other solid state imaging devices.

The term "substrate," as used herein, is to be understood as including substrates of silicon, epitaxial silicon, silicon-on-insulator (SOI) or silicon-on-sapphire (SOS) technology, doped and undoped semiconductors, and other semiconductor structures used in integrated circuit fabrication. Furthermore, when reference is made to a "substrate" in the following description, previous processing steps may have been utilized to form regions, junctions, or material layers in or over the base semiconductor structure or foundation. In addition, the semiconductor need not be silicon-based, but could be based on silicon-germanium, germanium, gallium arsenide or other semiconductor material.

The following embodiments employ shared pixel component architectures that arrange each of the shared pixel components within a respective one of the sharing pixels. Such distribution of the shared pixel components allows for greater pixel layout uniformity, and allows for variation in the number of pixels and shared pixel components without redesigning their layouts. In particular, the following embodiments employ shared pixel component architectures having substantially uniform pixels that each include one of a reset, source follower, row select, or dummy transistor. However, this disclosure does not suggest that the shared pixel component architectures are limited to or must employ particular types of shared pixel components; nor does it suggest that the pixels and shared pixel components must have a one-to-one correspondence, similar layouts, particular layout configurations, or particular arrangements within a pixel array. Accordingly, the following detailed description is not to be taken in a limiting sense.

Figure 4A:
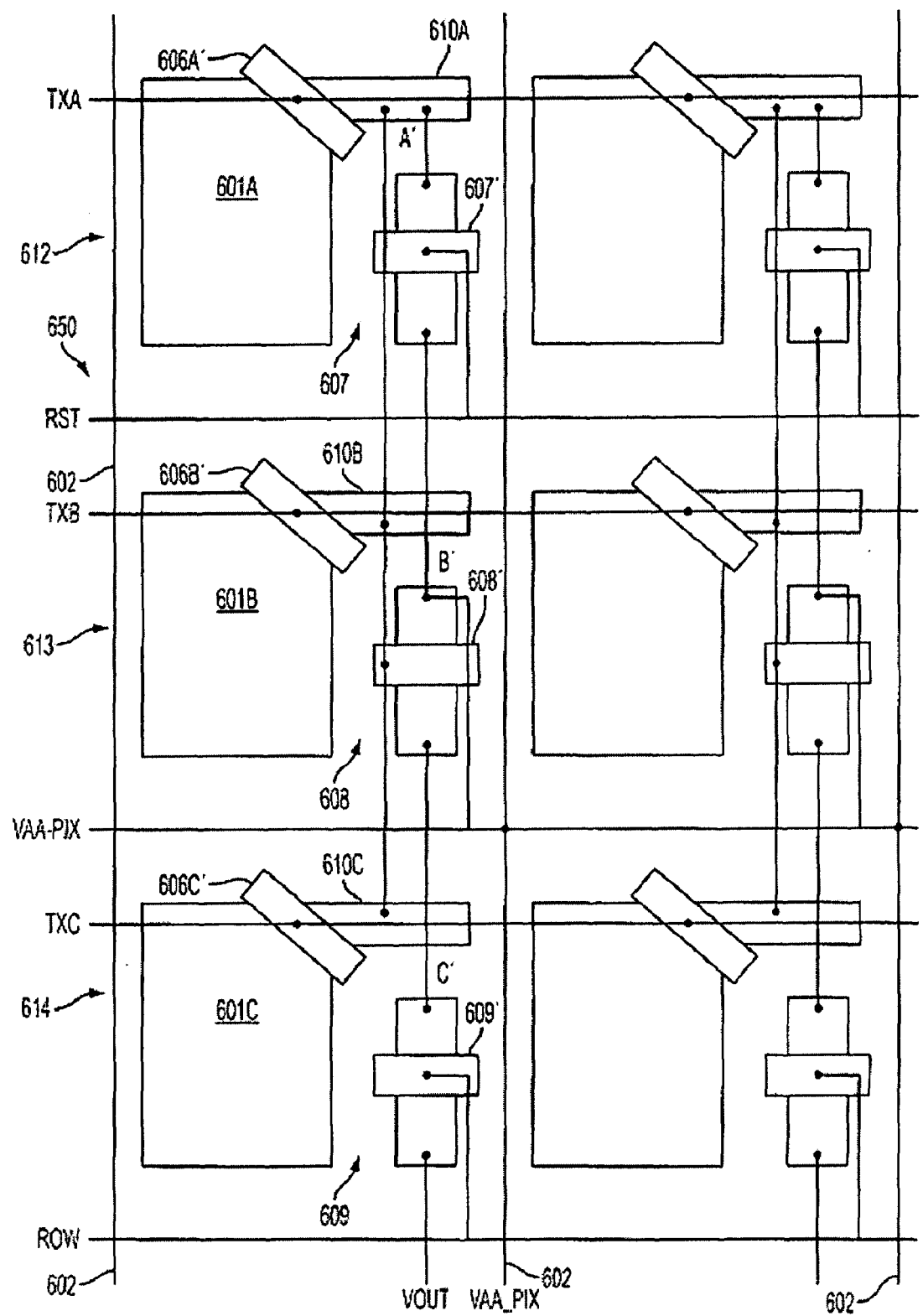
FIG. 4A is a top-down view layout of a portion of a first pixel array employing a shared pixel component architecture in accordance with a first embodiment described herein.
Figure 4B:
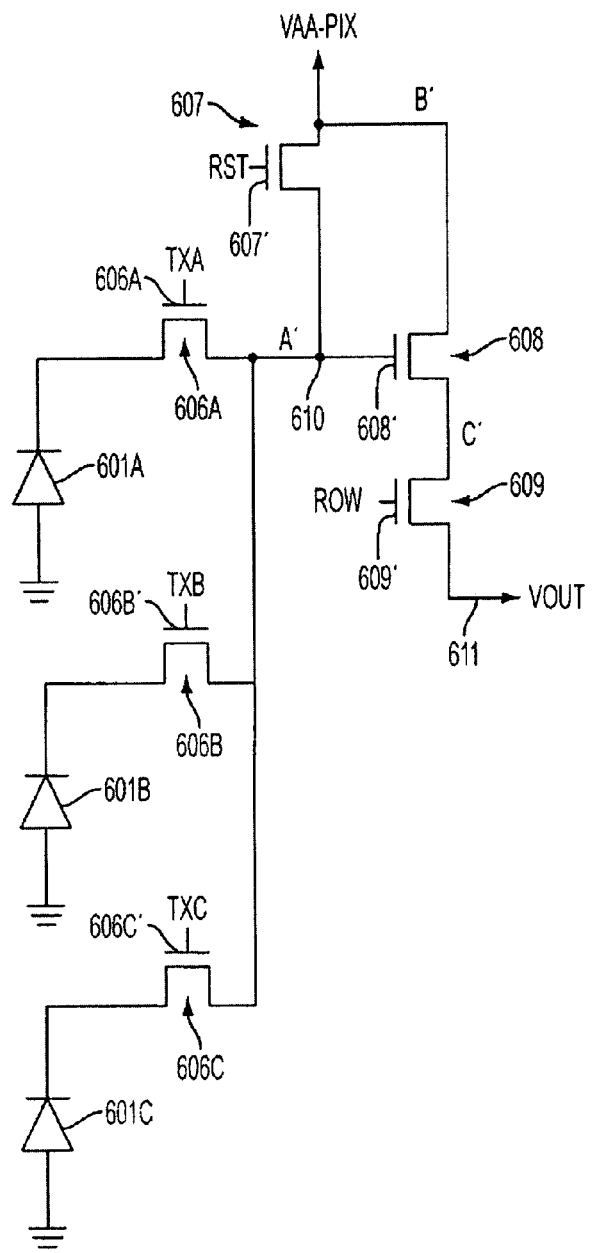
FIG. 4B is a circuit diagram of the FIG. 4A portion of the first pixel array.

Now referring to the figures, where like numerals designate like elements, FIGS. 4A-B respectively illustrate a top-down view layout and circuit diagram of a three-way shared pixel component architecture for pixels 612-614 of a pixel group 650 within a pixel array containing a plurality of such groups.

Each of the pixels 612-614 includes a respective one of a plurality of floating diffusion regions 610A-C, which are electrically interconnected by conductor 690 to establish a common floating diffusion node 610. Each of the pixels 612-614 also includes a respective one of the shared pixel transistors 607-609 and a corresponding gate 607'-609', which in this embodiment correspond to a reset 607, source follower 608, or row select 609 transistor forming shared readout circuitry of the pixel group 612-614.

The photosensors 601A-C are formed within a semiconductor substrate by forming doped regions at varying depths. Each of the charge transfer transistors 606A-C includes a charge transfer gate 606A'-C' and corresponding channel region configured to transfer photocharges from a respective photosensor 601A-C to one of the floating diffusion regions 610A-C. The photosensors 601A-C, source/drain and channel regions of the charge transfer transistors 606A-C and shared readout transistors 607-609, and floating diffusion regions 610A-C are "active areas" of the pixel group 650, which refers to regions within the substrate that are electrically active. Representative interconnections are shown between some of the active areas and gate structures of FIG. 4A of this embodiment. The electrical schematic of the FIG. 4A layout is shown in FIG. 4B. Portions of those representative interconnections are labeled with reference characters A'-C', which correspond to portions of the FIG. 4B circuit diagram. These interconnections may be formed by electrical contacts, e.g., conductive plugs located directly over the active areas and gate structures, connecting the respective active areas and gate structures to upper level metallization layers. The active areas, gate structures, contacts, and metallization layers of these interconnections may be formed by methods well known in the art.

Because the shared pixel components 607-609 are respectively distributed, one each, among pixels 612-614, the top-down view layout of each pixel can be made substantially uniform. Because the top-down view layout of each pixel is not constrained by a grouped arrangement of the shared pixel components 607-609 (e.g., like the shared pixel components 407-409 of FIG. 4A), the top-down view layouts of the like pixel components (e.g., photosensors, charge transfer gates, and floating diffusion regions) can have substantially the same orientation and location with respect to their respective pixels 612-614, as well as the same dimensions with respect to one another. In other words, the top-down view layouts of components within each pixel can have substantially the same shape, orientation, dimensions, and locations relative to components of other pixels within the group 650 and other pixels within the entire pixel array.

For example, as shown in FIG. 4A, the charge transfer gates 606A'-C' are oriented at the same angle with respect to a row-wise or column-wise direction of the pixels 612-614. The charge transfer gates 606A'-C' also have the same location in each of pixels 612-614, e.g., at about the top-center of each pixel 612-614. Further, the charge transfer gates 606A'-C' have the same top-down view width and length dimensions with respect to one another. Likewise, the photosensors 601A-C and floating diffusion region 610A-C have the same orientation, location, and dimensions in all pixels 612-614. The distribution of the shared pixel components 607-609 permits them to be treated as like pixel components with uniform layouts, as well. Each of the shared pixel components 607-609 has the same orientation, location, and dimensions. For instance, as can be seen, the gates 607'-609' and respective active areas (i.e., source/drain and channel regions) of the reset 607, source follower 608, and row select 609 transistors are each oriented at the same angle with respect to a row-wise or column-wise direction of the pixels 612-614, have the same location within the respective pixels 612-614, and have the same length and width dimensions.

In this embodiment, the top-down view layouts of the pixels 612-614, which are determined only by the orientations, locations, and dimensions of the respective photosensors 601A-C, charge transfer gates 606A'-C', floating diffusion regions 610A-C, and included shared pixel components 607-609), are substantially the same. As shown, the pixels 612-614 are aligned and adjacent to one another within the same column. Accordingly, the uniformity of their layouts causes the like components to be aligned, with equidistant spacing from one another, in a column-wise direction. As can be seen, the respective spacing between the photosensors 601A-B, charge transfer gates 606A'-B', and floating diffusion regions 610A-B of pixels 612 and 613 is the same as the respective spacing between those components in pixels 613 and 614. Similarly, like components of aligned and adjacent pixels within the same row (shown in the pixel column to the right of pixels 612-614) will be also be aligned with equidistant spacing in a row-wise direction.

It should be understood that so long as three or more respective pixel components have the same location within their respective pixels (e.g., the gates 607'-609' of the shared pixel components 607-609 are similarly located within their respective pixels 612-614), those components will be aligned and equidistant from one another if their respective pixels are uniformly spaced within the same pixel column or row (e.g., if their respective pixels have the same column-wise length and are adjacently arranged in the same column). Thus, the uniform layouts of the pixels 612-614 and their components not only provide greater simplicity and consistency amongst the pixels 612-614 themselves, but also provide greater simplicity and consistency amongst the signal lines, isolation structures, and the like serving the pixels 612-614. For example, as can be seen from FIG. 4A, the STI barriers 602 for isolating the pixels 612-613 from adjacent pixel columns are straight and evenly spaced. Further, the signal lines TXA-C of the charge transfer gates 606A'-C' are straight and evenly spaced. As understood within the art, such uniformity further improves pixel array performance and lowers manufacture costs.

Figure 1A:
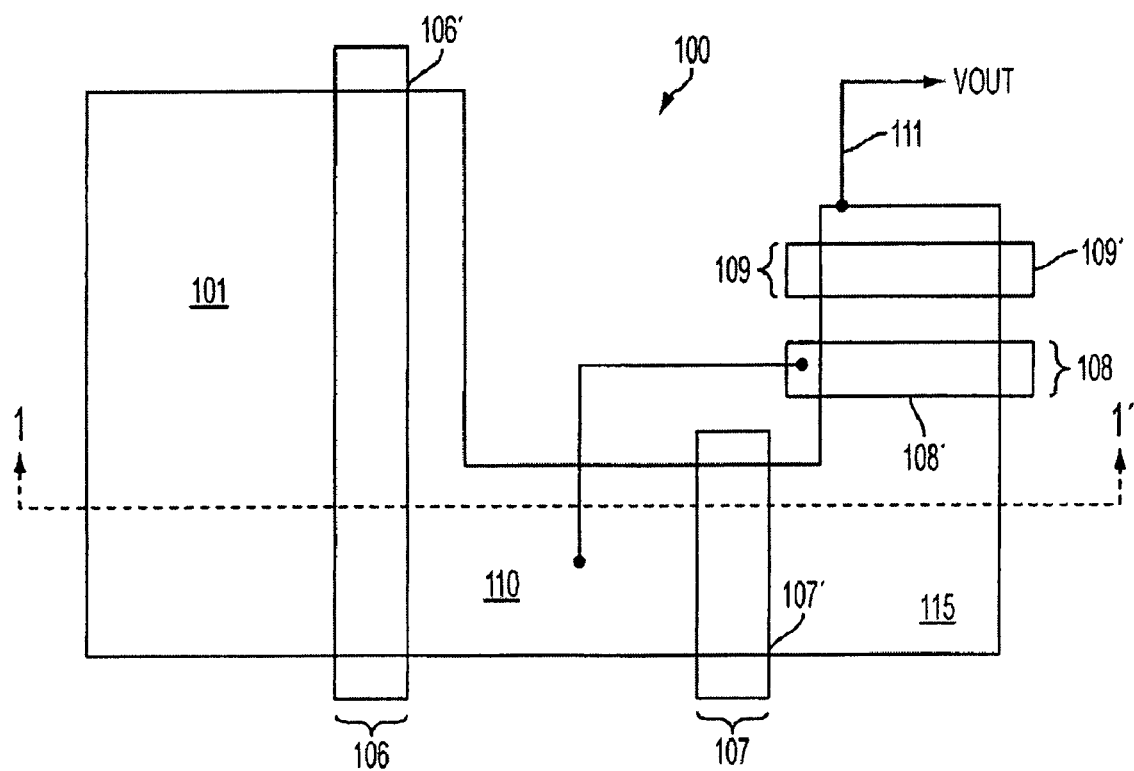
FIG. 1A is a top-down view layout of a CMOS pixel.
Figure 1B:
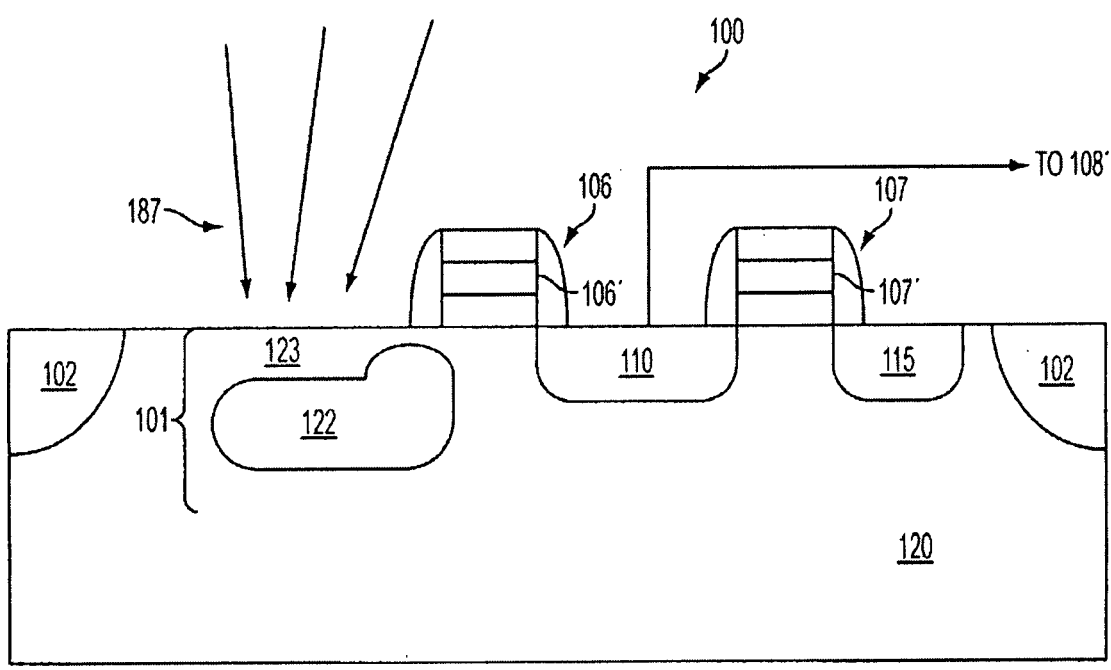
FIG. 1B is a cross-sectional view of the FIG. 1A pixel taken along line 1-1'.
Figure 1C:
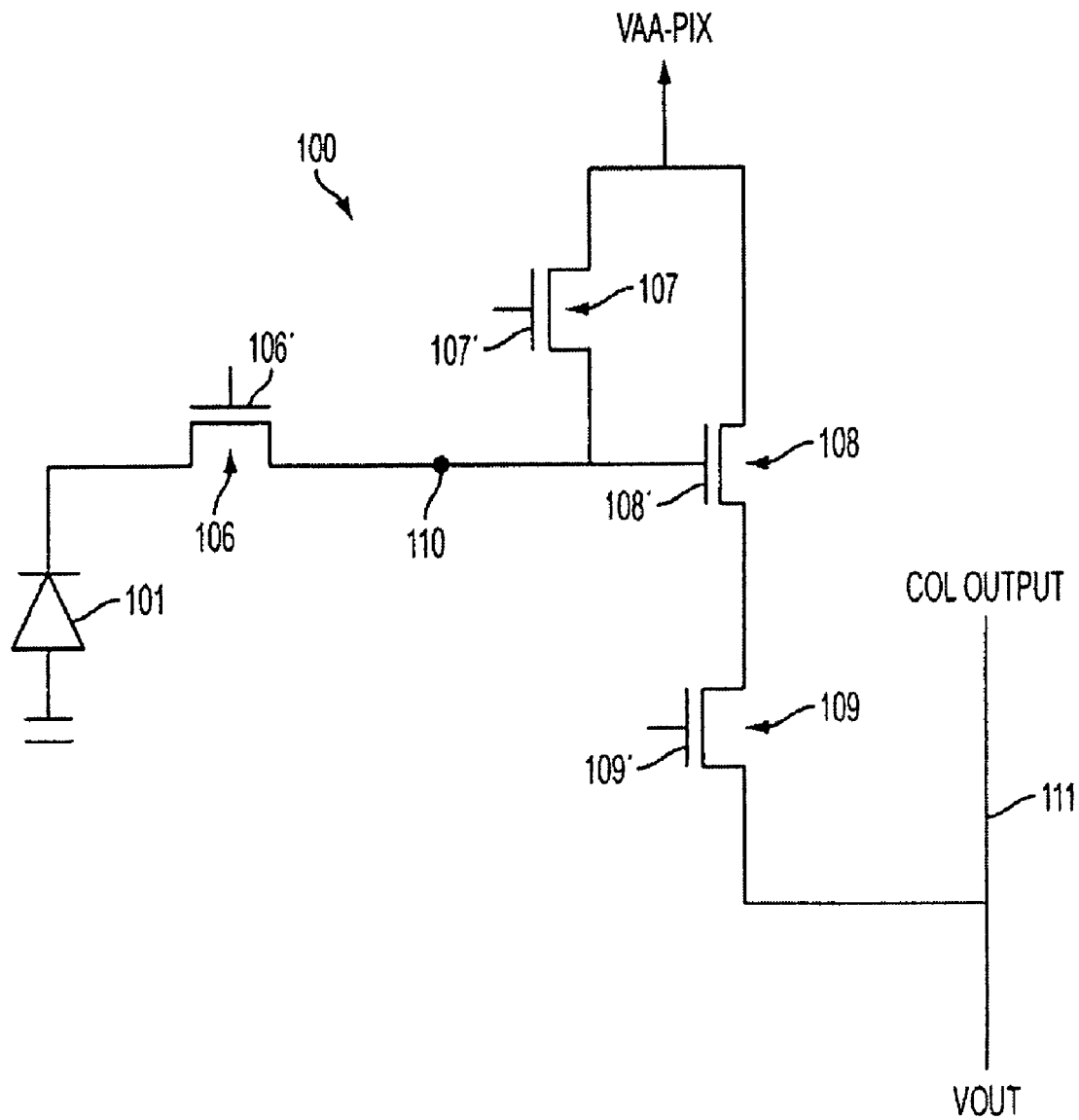
FIG. 1C is a circuit diagram of the FIG. 1A pixel.
Figure 2A:
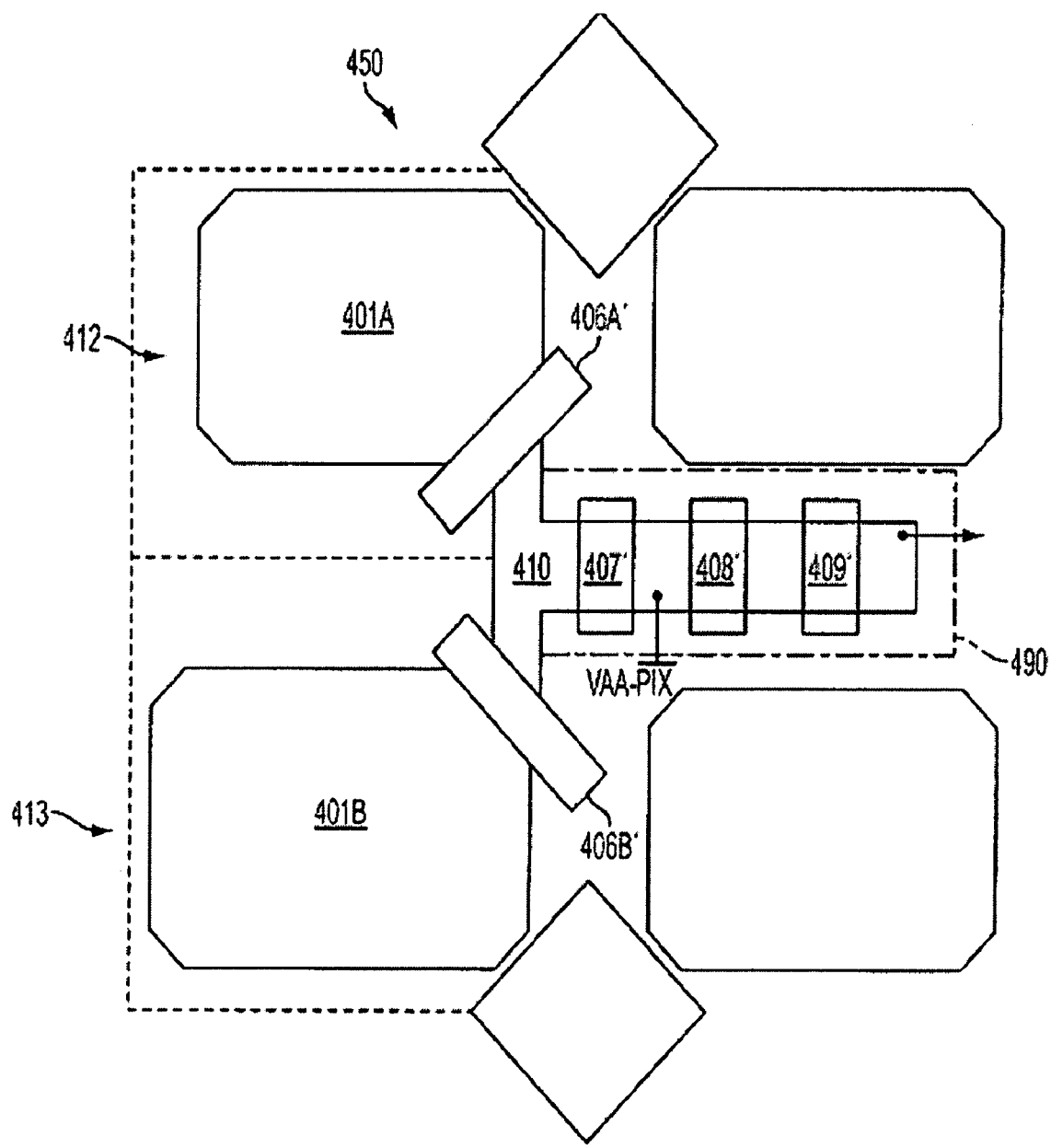
FIG. 2A is a top-down view layout of a portion of a pixel array employing a shared pixel component architecture.
Figure 2B:
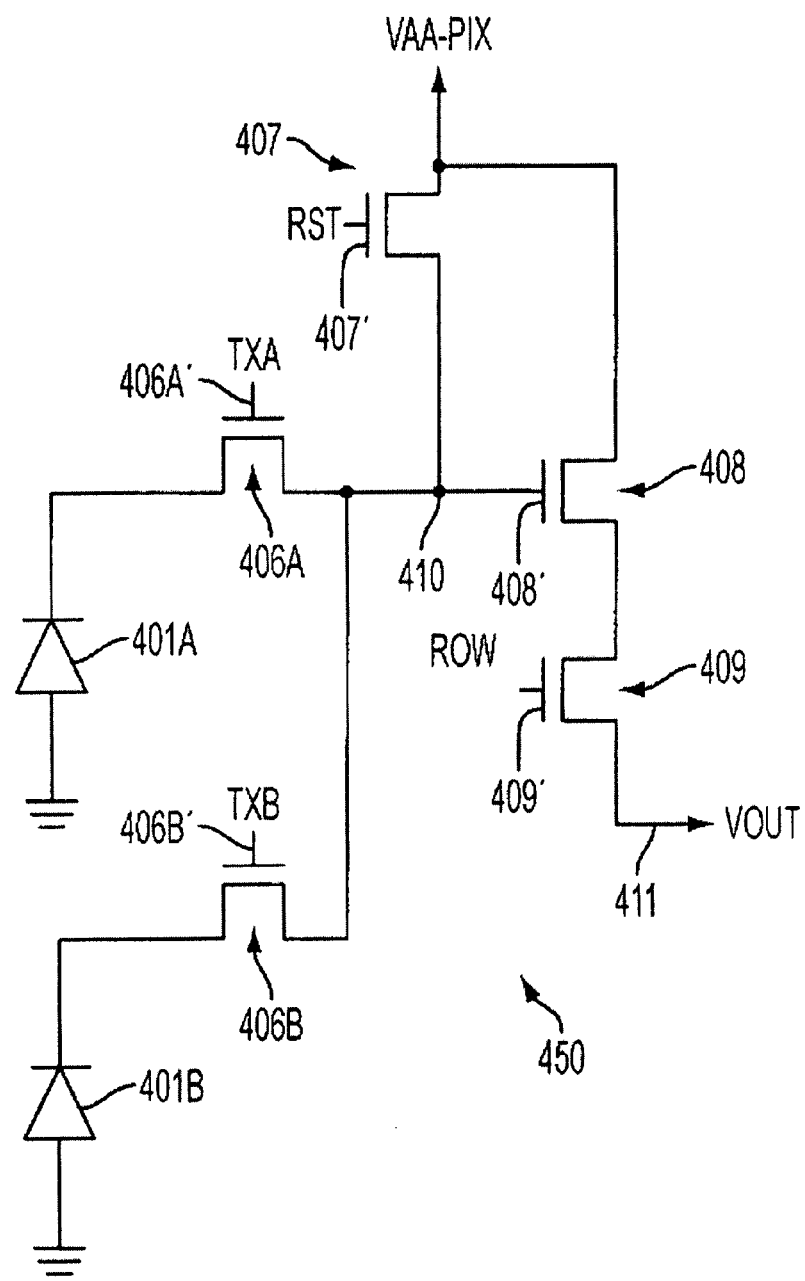
FIG. 2B is a circuit diagram of the FIG. 2A portion of the pixel array.
Figure 3:
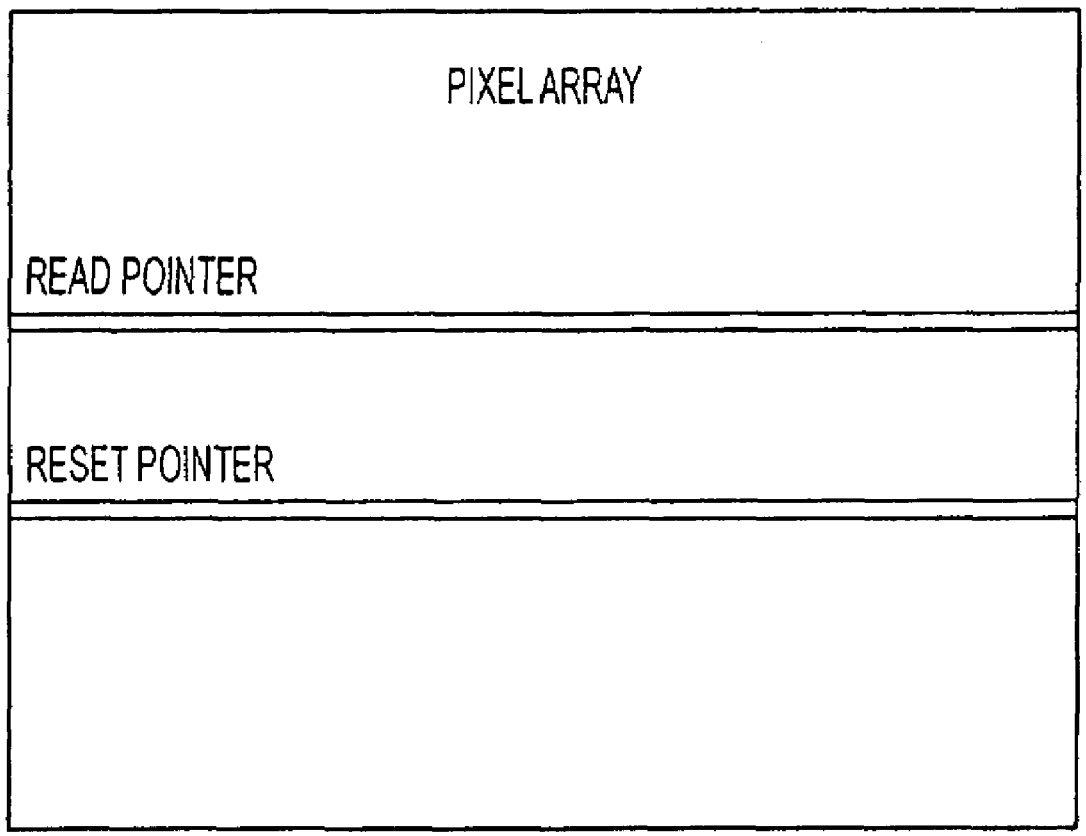
FIG. 3 is a diagram of a pixel array employing a rolling shutter operation.
Figure 4C:
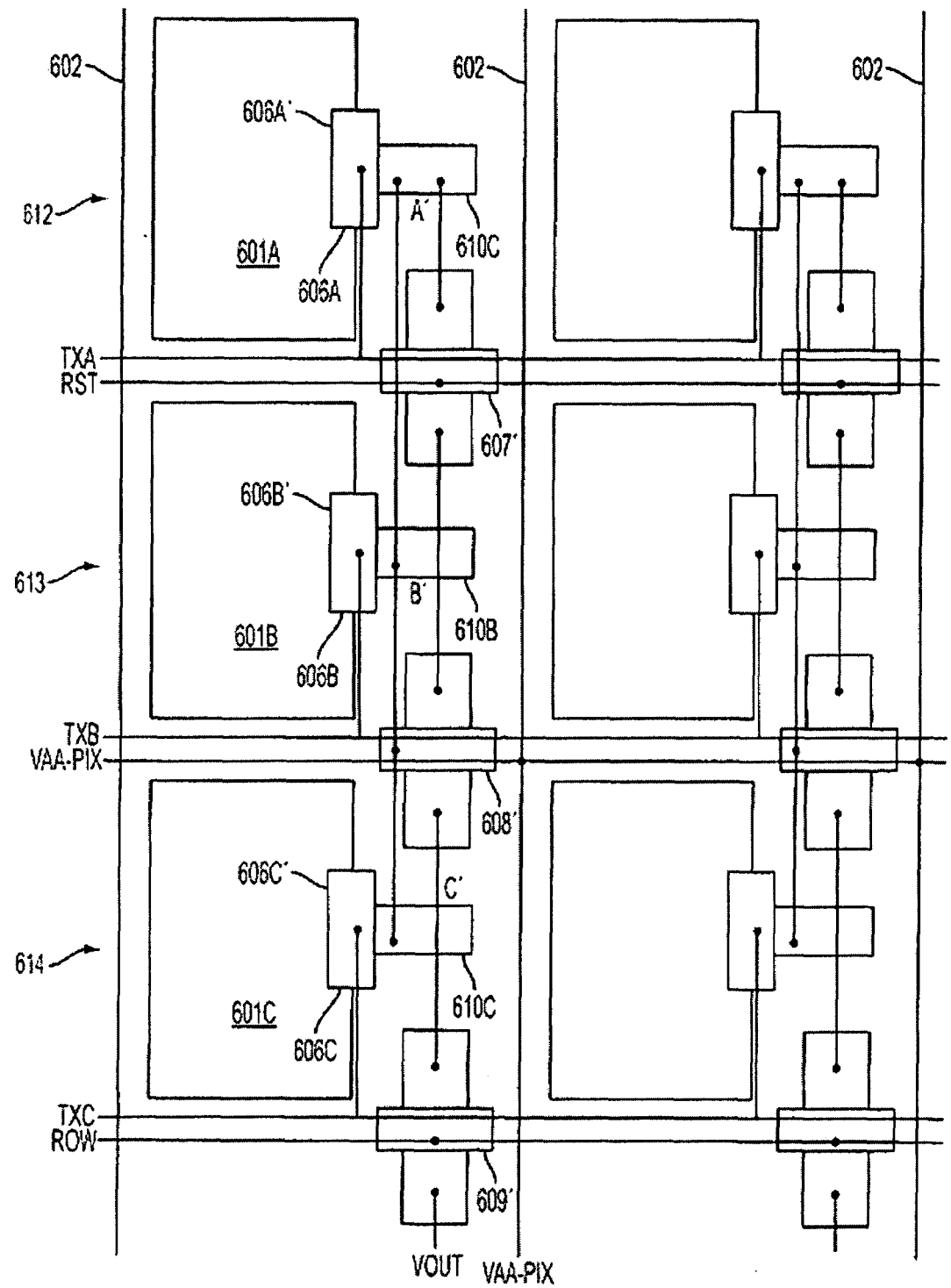
FIG. 4C is a top-down view layout of an alternative configuration of the FIG. 4A portion of the first pixel array.

Because the shared pixel components 607-609 are not topographically grouped together, such as the shared pixel components 407-410 of the trunk 490 shown in FIG. 2A, each of the shared pixel components 607-609 can be individually oriented and located within a small region of the pixel group 650. For instance, the shared pixel transistors 607-609 of pixel group 650 are each tucked into a recess formed by a respective photosensor 601A-C and floating diffusion region 610A-C. The active areas of the readout circuitry are thereby removed from the regions separating the pixels 612-614 (e.g., as compared to the active areas of the shared trunk 490 of FIG. 2A), which allows for less separation between the pixels 612-614. In an alternative configuration illustrated by FIG. 4C, the floating diffusion regions 610A-C and shared transistors 607-609 are shifted such that the charge transfer transistors 606A-C are not arranged between the pixels 612-614 in the column-wise direction. As better pixel isolation is achieved, there is less need for a barrier structure. More pixel area can therefore be provided to other components. For example, if only dopant implantation is used to separate the pixels 612-614 in the column-wise direction, instead of shallow trench isolation (STI) or local oxidation of silicon (LOCOS), then more pixel space can be allocated to the photosensors 606A-C.

Figure 5:
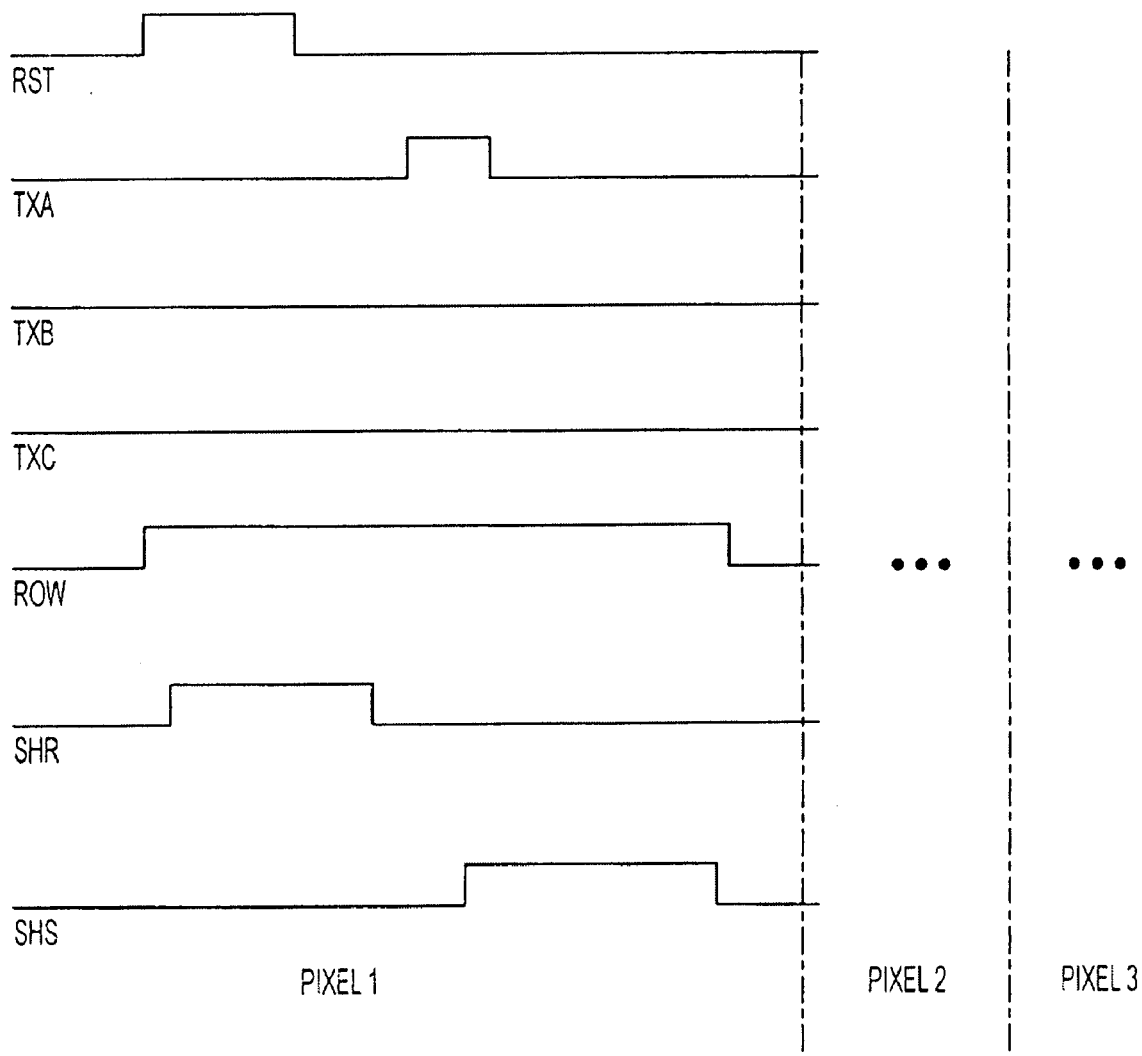
FIG. 5 is a timing diagram depicting a method of operating the FIG. 4A portion of the first pixel array.

FIG. 5 is a timing diagram depicting a method of operating the pixels 612-614 and shared reset transistor 607, source following transistor 608, and row select transistor 609, of the first pixel group 650. With reference to FIGS. 4A-B, the timing diagram of FIG. 5 depicts a method of operating shared reset 607, source follower 608, and row select 609 transistors to read out the pixel output voltage VOUT, which as previously noted can represent respective reset Vrst and photosignal Vsig voltages of the pixels 612-614. The pixel group 650 arranges the pixels 612-614 within the same column and employs a rolling shutter to switch among their use of the shared pixel components 607-609. It should be understood, however, that the pixels 612-614 need not be arranged in the same column, nor arranged adjacent to one another.

The readout operation starts with the first of the pixels 612-614 to be designated by the Reset pointer of the rolling shutter, e.g., begins with a reset of pixel 612 (and other pixels of that pixel row). The readout operation is now further described with reference to pixel 612, which corresponds to "Pixel 1" of FIG. 5. As shown, a reset signal (RST) is pulsed to activate the reset transistor 607, which sets the floating diffusion node 610 to a reset potential which is applied to the gate 608' of the source follower transistor 608 to produce a corresponding reset voltage Vrst. A sample hold reset signal (SHR) is pulsed to initiate sampling and holding of the reset voltage signal Vrst on a column line 611 to which pixel 612 is connected. The signal Vrst is applied to the column 611 line by the row select transistor 609 when activated by a row select signal ROW.

The integration period of the pixel 612 may start with a reset of the photosensor 601A, which can be achieved by simultaneously pulsing the charge transfer (TXA) and reset (RST) signals to sweep charge from the photosensor 601A out through the charge transfer 606A and reset 607 transistors. At completion of the integration period, the transfer signal (TXA) is again pulsed to activate the charge transfer transistor 606A of pixel 612, such that charges accumulated at the photosensor 601A during the integration period are transferred through the charge transfer transistor 606A to the common floating diffusion node 610. A sample and hold photo signal (SHS) is pulsed to initiate sampling and holding of the signal voltage Vsig produced by the source follower transistor 608 on the column line 611 through the activated row select transistor 609. The differential signal (Vrst−Vsig) for pixel 612 is then generated by an analog readout circuit to indicate a value of the pixel 612. As can be seen from FIG. 5, the above process is subsequently repeated for each of pixels 613 and 614, in row sequence by the rolling shutter readout, using their respective charge transfer transistors 606B-C and charge transfer signals TXB and TXC. In other words, the control signals for Pixel 1 are repeated for each of Pixels 2 and 3, but the respective TXB' and TXC transfer signals are pulsed instead of TXA. A more complete description of the sample and hold operation, analog signal processing, and conversion of the analog signal to a digital signal will be described below in connection with FIG. 10.

Figure 6A:
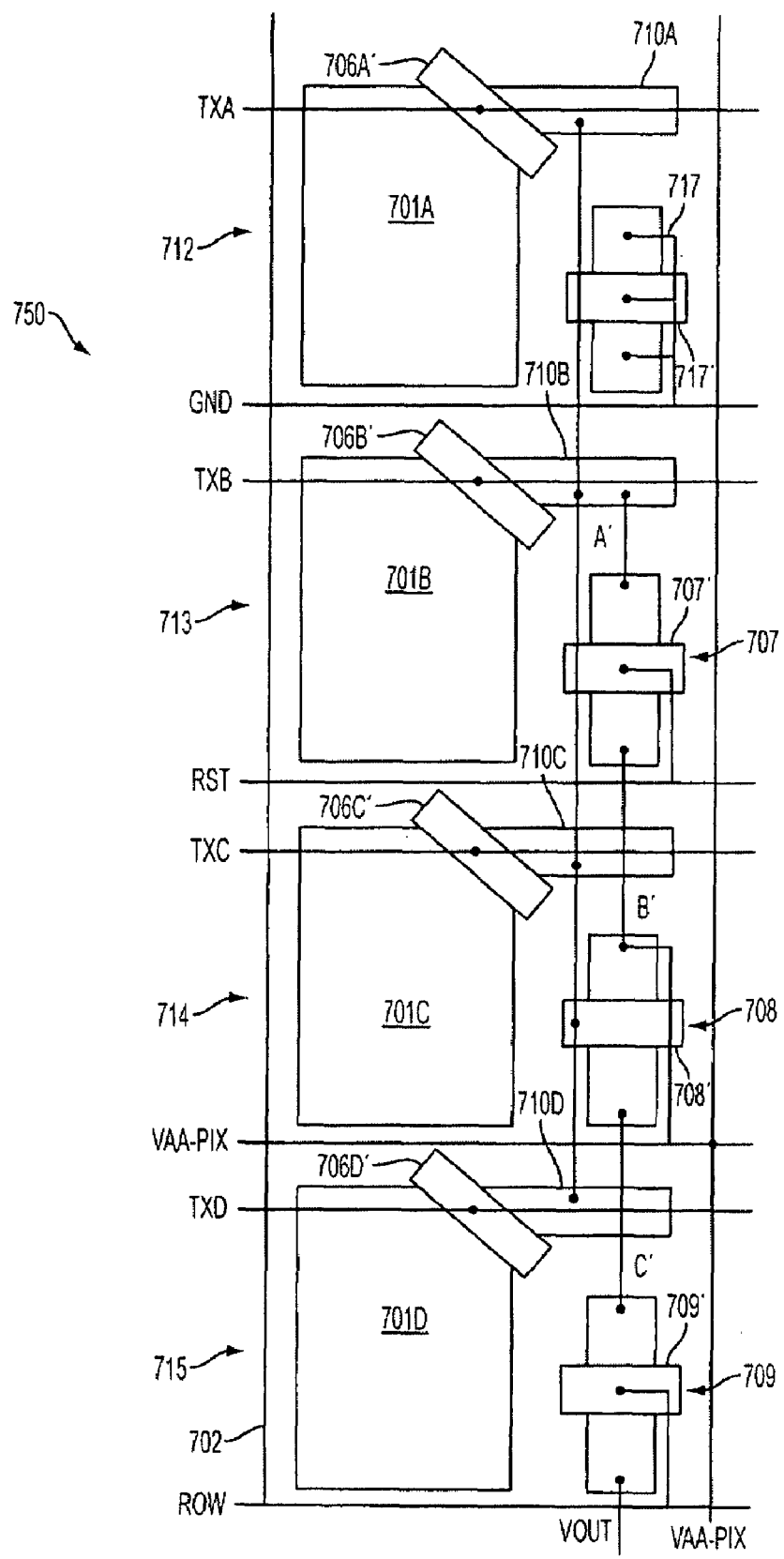
FIG. 6A is a top-down view layout of a portion of a second pixel array employing a shared pixel component architecture in accordance with a second embodiment described herein.
Figure 6B:
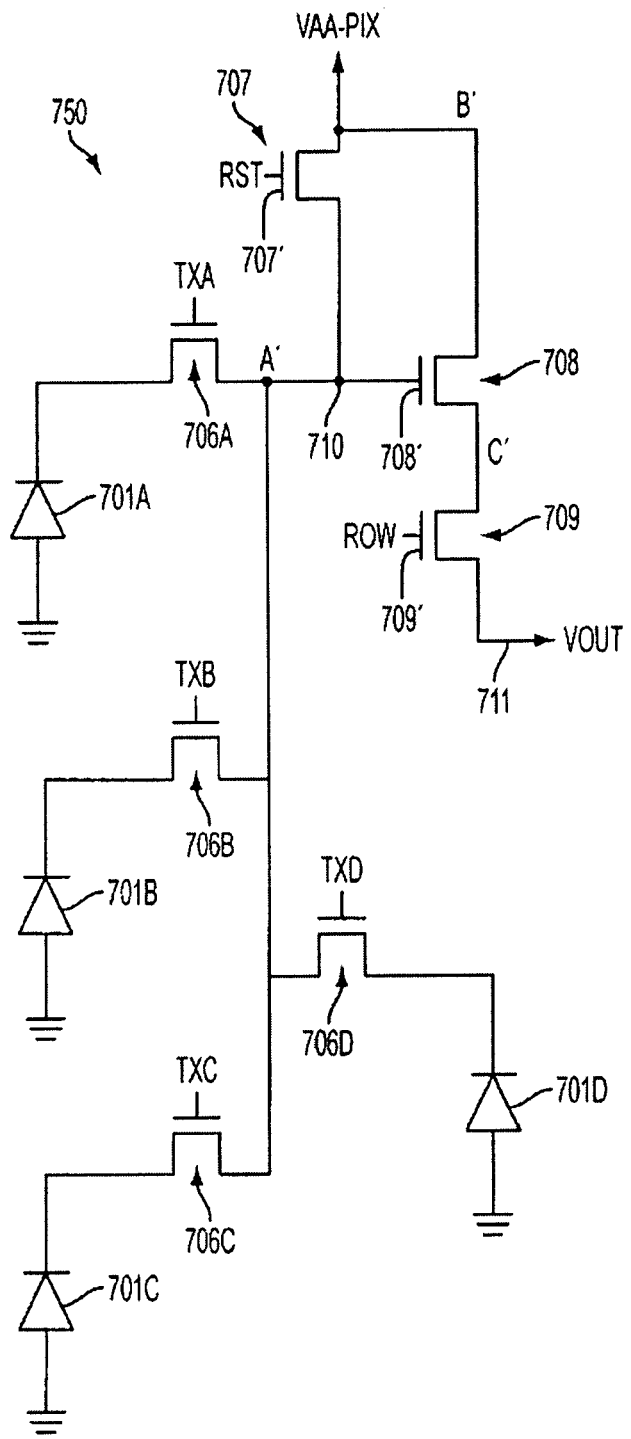
FIG. 6B is a circuit diagram of the FIG. 6A portion of the second pixel array.

FIGS. 6A-B respectively illustrate a top-down view layout and schematic circuit diagram of a shared pixel component architecture for pixels 712-715 of a second embodiment having a second pixel group 750 of a pixel array containing a plurality of such groups. A portion of a single pixel column is illustrated in FIGS. 6A-B. Each pixel 712-715 layout includes a respective photosensor 701A-D, a respective charge transfer transistor 706A-D, a respective charge transfer gate 706A'-D', a respective floating diffusion region 710A-D (all commonly connected to a floating diffusion node 710), and includes one of the shared transistor components 707-709, 717 and a corresponding gate 707'-709', 717'. In this embodiment the shared components are a reset 707, source follower 708, row select 709, and dummy 717 transistor, all having substantially the same construction and arrangement within each pixel. The FIGS. 6A-B embodiment is a four-way shared pixel group 750.

As can be seen, the electrical schematics of FIGS. 4B and 6B are nearly identical, with the sole exception being that the electrical schematic of FIG. 4B has three circuit branches for respective photosensors 601A-C of pixels 612-614 and the electrical schematic of FIG. 6B has four circuit branches for respective photosensors 701A-D of pixels 712-715. However, in comparison to the pixels 612-614 of pixel group 650, the shared pixel component architecture of pixels 712-715 has a pixel 712 that includes a dummy transistor 717 and corresponding dummy gate 717' in lieu one of the shared readout transistors 707-709. In an optional design, the dummy transistor 717 may be omitted and just the dummy gate 717' is provided. The additional pixel 712 is connected, as shown, to the shared readout transistors 707-709 in the same manner as the other three pixels 713-715. While the dummy transistor 717 and gate 717' are not interconnected with other components of pixels 712-714, they have substantially the same layout as the transistors 707-709 and associated gates 707'-709' of the shared pixel components 707-709.

The dummy transistor 717 and associated gate 717', or optionally just the dummy gate 717', may serve as a terminal contact for grounding surrounding regions of the pixel group 750, including channel regions of one or more of the charge transfer transistors 706A-D and shared readout transistors 707-709. The dummy gate 717' may interconnect an underlying substrate region with an overlying ground signal line GND. For typical n-substrate or n-substrate alike imagers, the pixel grounding is weak towards the center of the pixel array, because the pixel ground contacts are arranged only at the edges of the pixel array. In the configuration of FIG. 6A, an in-pixel ground is added via dummy transistor 717, which has a gate 717' and source/drain-like regions connected to the overlying ground line GND. The dummy transistor 717 of the first pixel 712, if repeated throughout the pixel array, can evenly distribute ground contacts throughout the center of the array by placing such a contact within each of a plurality of pixel groups 750. As a result, a better uniformity in pixel performance is achieved throughout the array. The pixels 712-715 can be read out in the same manner as described above for the embodiment depicted in FIGS. 4A-B with the addition of one additional transfer signal TXD for the fourth pixel 715.

Figure 7A:
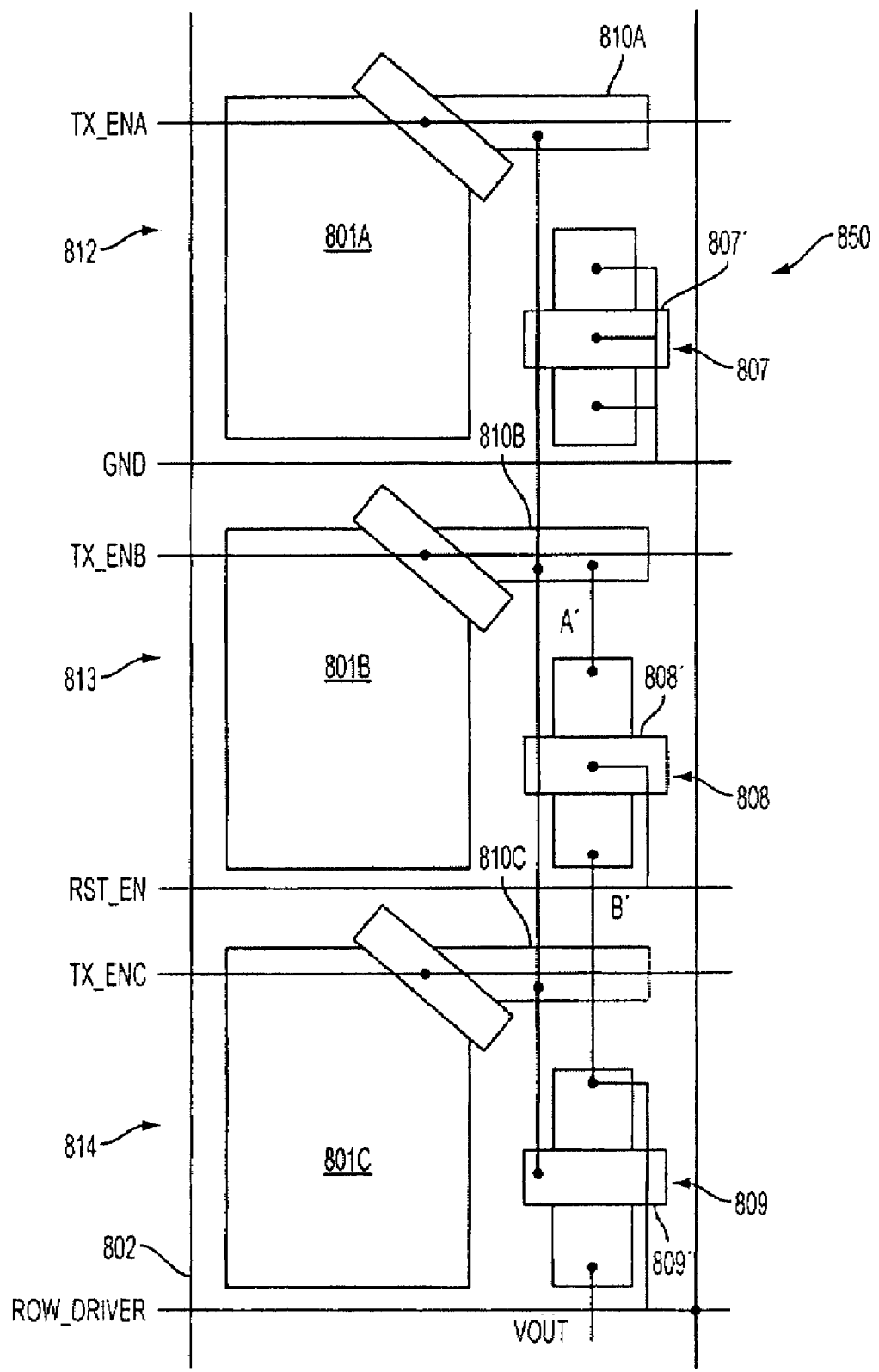
FIG. 7A is a top-down view layout of a portion of a third pixel array employing a shared pixel component architecture in accordance with a third embodiment described herein.
Figure 7B:
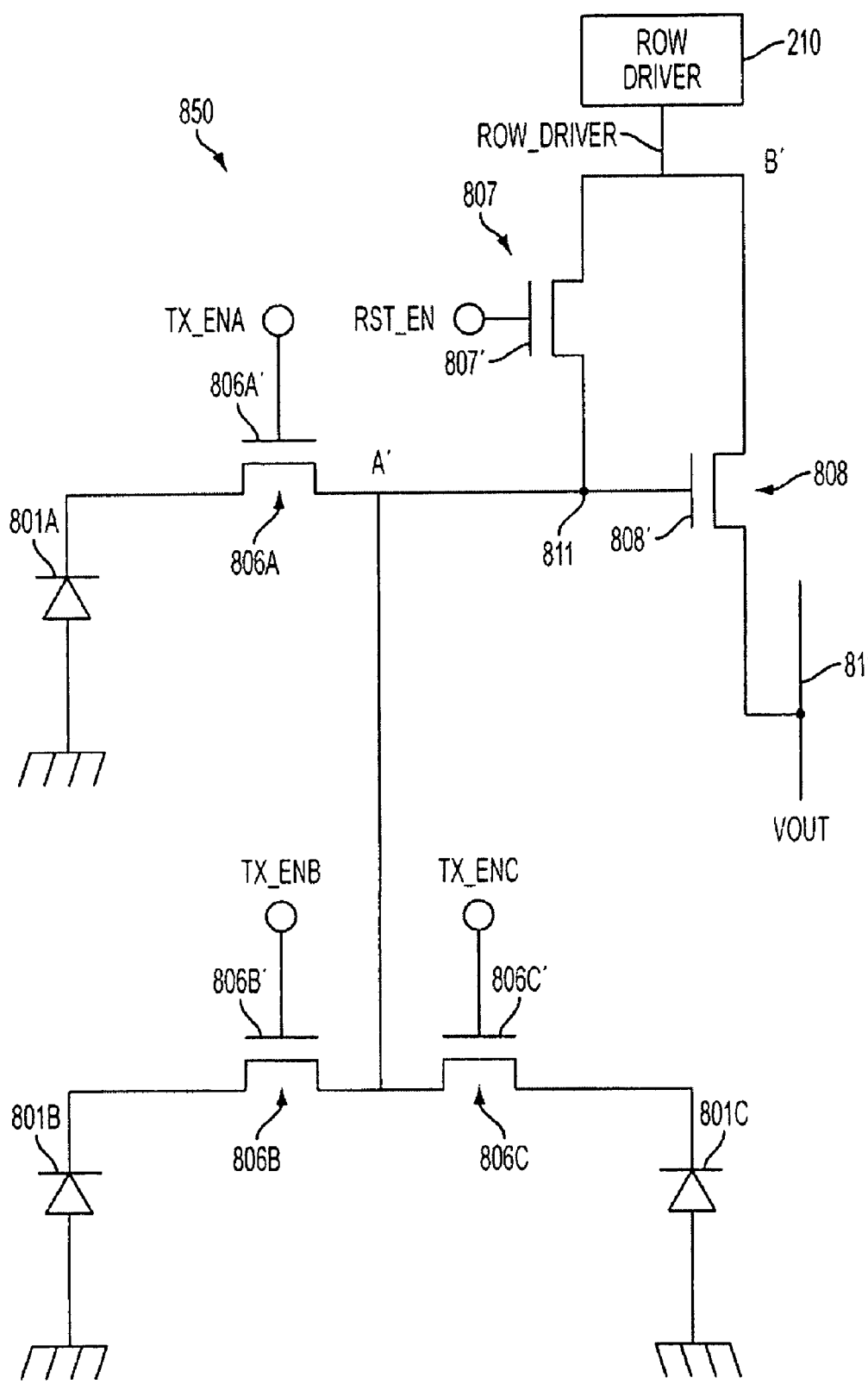
FIG. 7B is a circuit diagram of the FIG. 7A portion of the third pixel array.

FIGS. 7A-B respectively illustrate a top-down view layout and circuit diagram of a third embodiment of a shared pixel component architecture for pixels 812-814 of a third pixel group 850 of a pixel array containing a plurality of such groups. Each pixel 812-814 includes a respective photosensor 801A-C, a respective charge transfer 806A-C, a respective charge transfer gate 806A'-C', a respective floating diffusion region 810A-C (all commonly connected to a floating diffusion node 810), and one of the shared pixel components 807-808, 817 and corresponding gates 807'-808', 817'. In this embodiment the shared pixel components correspond to reset 807, source follower 808, and dummy 817 transistors, which are constructed the same. The pixels 812-814 do not employ a shared row select transistor as in prior embodiments. Instead, a row driver circuit 210 is provided which selectively applies an operating voltage to the reset 807 and source follower 808 transistors as described in U.S. Pat. No. 7,176,434 assigned to Micron Technology, Inc., and hereby incorporated by reference in its entirety.

Figure 8A:
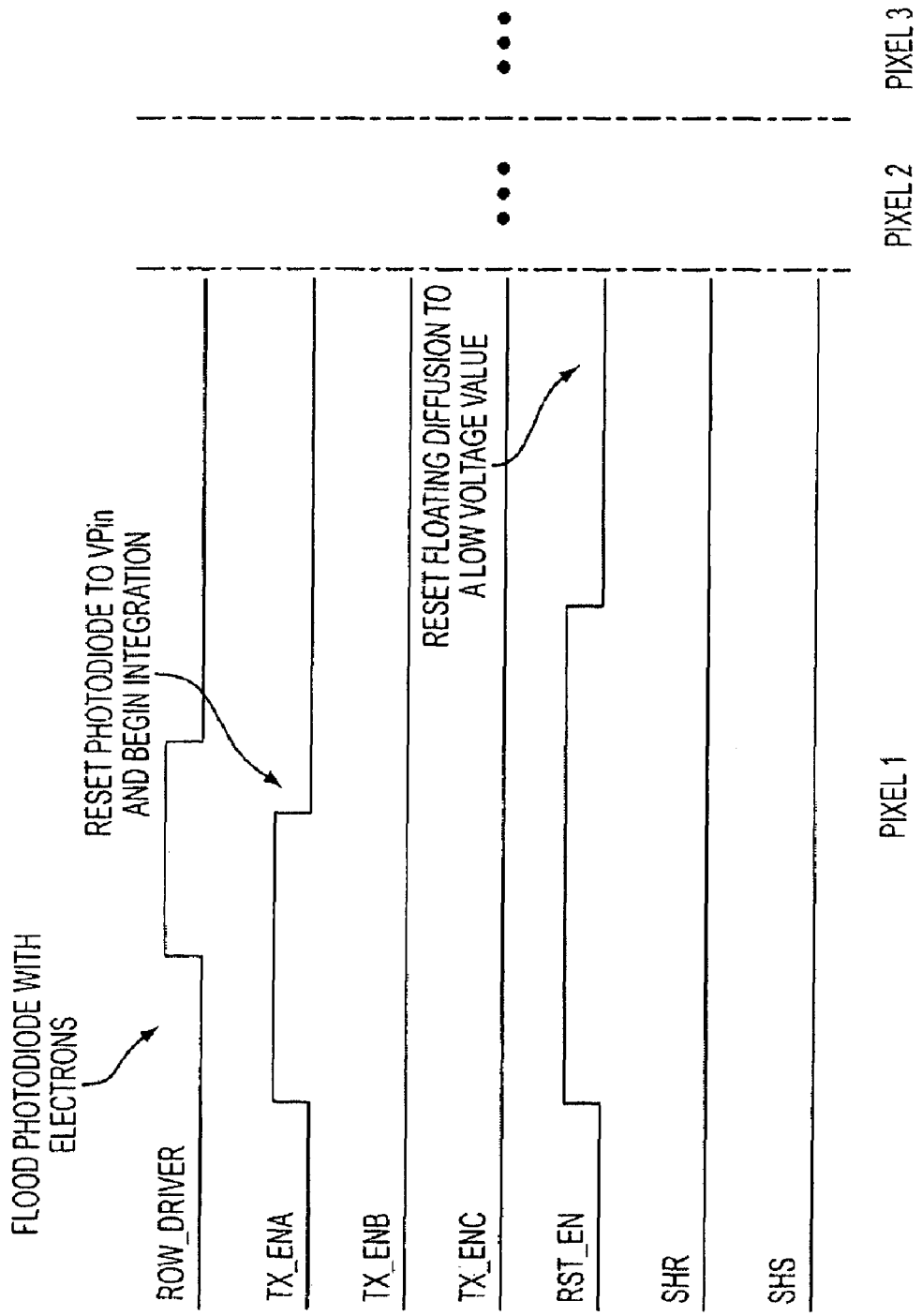
FIG. 8A is an integration timing diagram illustrating a method of operating the FIG. 7A portion of the third pixel array.
Figure 8B:
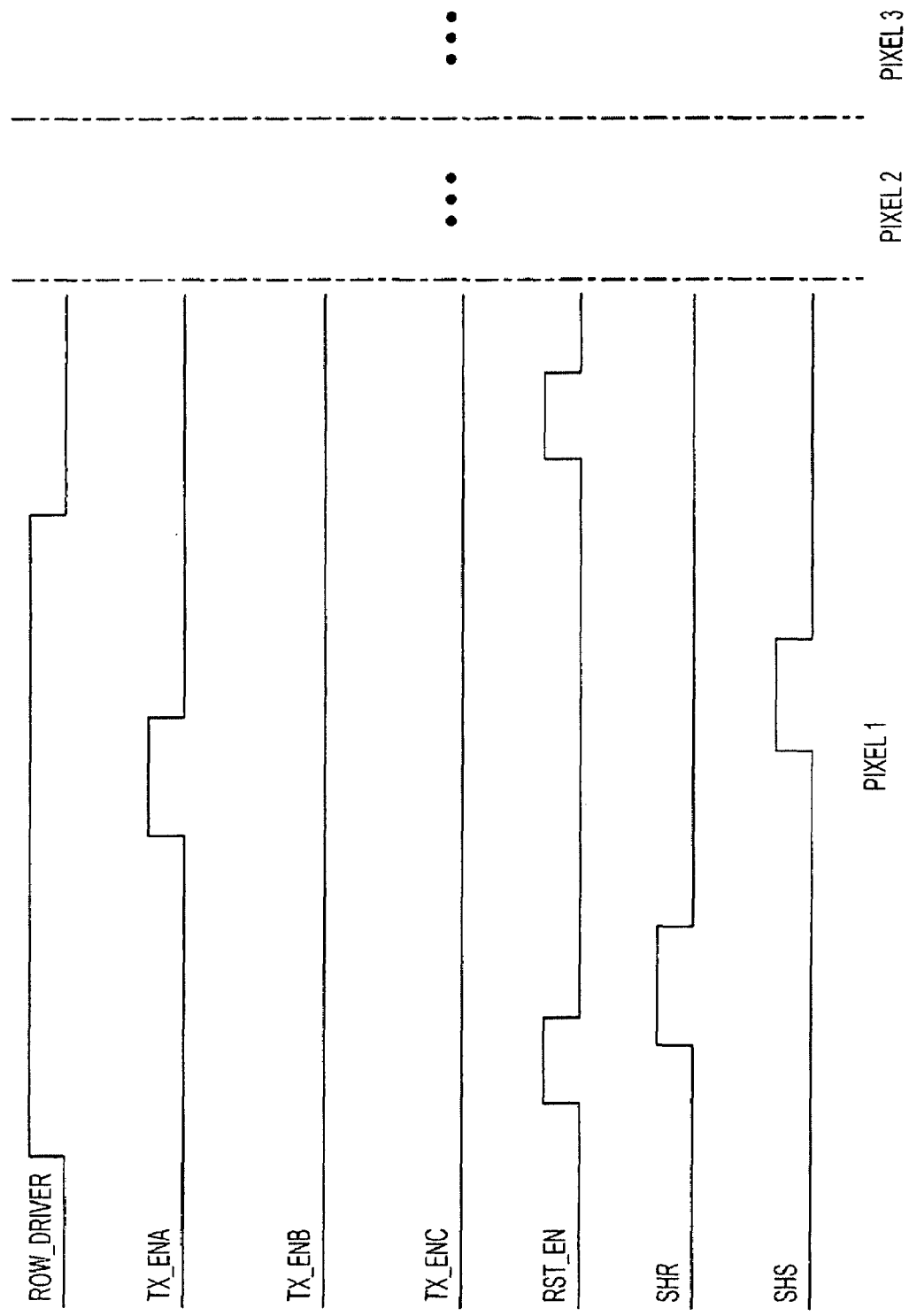
FIG. 8B is readout timing diagram illustrating a method of operating the FIG. 7A portion of the third pixel array.
Figure 10:
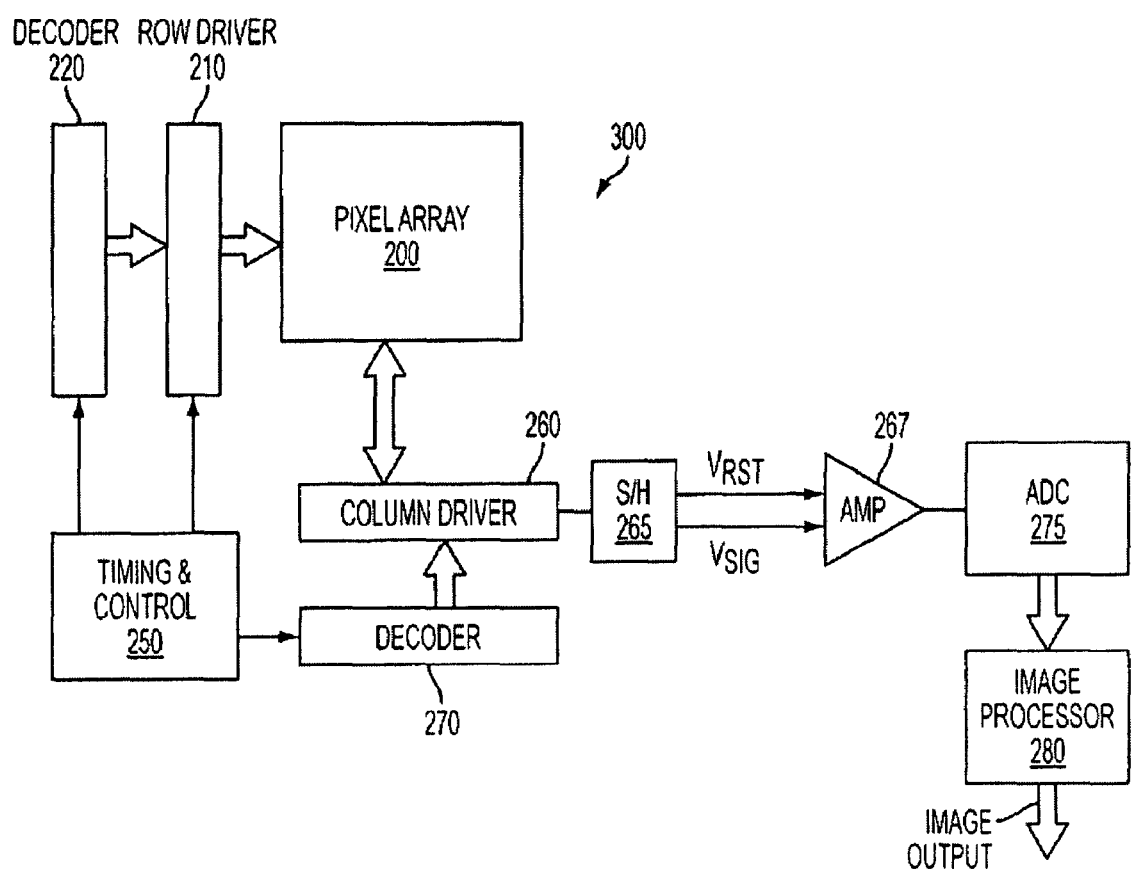
FIG. 10 is a block diagram of a CMOS imager constructed in accordance with one or more embodiments described herein.

FIGS. 8A-B illustrate integration and readout timing diagrams, respectively, for operating each of the pixels 812-814 during charge integration and pixel readout. Like the pixels 612-614 of pixel group 650, the pixels 812-814 use the shared pixel components 807-808 in accord with a rolling shutter operation. Thus, though the operations are repeated for each pixel 812-814 using respective transfer gate control signals TX_ENA, TX_ENB, TX_ENC, they are now explained only with respect to pixel 812 (corresponding to a "Pixel 1" of FIGS. 8A-B) and further reference to FIG. 7B, which shows the pixels 812-814 as being connected to a row driver circuit 210 (FIG. 10).

The row driver circuit 210 supplies an operating voltage and reset voltage in the form of a row driver signal ROW_DRIVER. As shown by the integration timing diagram of FIG. 8A, initially, the signal ROW_DRIVER is set low; and the gate control signals for charge transfer transistor 806A (TX_ENA) and reset transistor 807 (RST_EN) are set high to allow the photodiode 801A and floating diffusion node 810 to fill with electrons. The ROW_DRIVER signal is then set high to drain most of the electrons from the photodiode 801A and floating diffusion node 810, which thereby resets the photodiode 801A. Next, the charge transfer signal TX_ENA is set low to turn off the charge transfer transistor 806A, thus isolating the reset photodiode 801A from the floating diffusion node 810. Thereafter, the ROW_DRIVER is set low again to drive down the potential of the floating diffusion node 810, which turns off the source follower transistor 808 and isolates the pixel 812 from the column output line 811. Finally, the reset transistor signal RST_EN is set low to isolate the floating diffusion node 810 from the ROW_DRIVER signal. Charge integration begins when the TX_ENA control signal goes low. As noted, the operation is subsequently repeated, for each of the pixels 813-814, using charge transfer transistors 806B-C and corresponding charge transfer signals TX_ENB and TX_ENC.

As shown by the readout timing diagram of FIG. 8B, at some point after charge integration has started, the ROW_DRIVER signal is pulsed high to provide an operating voltage across the source follower transistor 808. The floating diffusion node 810 of the pixel 812 is then reset by briefly activating the reset transistor 807, which drives the floating diffusion node 810 to the reset voltage level. The reset voltage level acts on the gate 808' of the source follower transistor 808, which consequently generates a reset voltage Vrst on the column output line 811. Setting of the reset sample and hold signal SHR to high then initiates sampling of the reset voltage Vrst by a first sample and hold capacitor within a sample and hold circuit 265 (FIG. 10) which is connected to the column output line 811.

While the ROW_DRIVER signal is still present, photocharge stored in the photodiode 801A, during an integration period, is then transferred to the floating diffusion node 810 by pulsing the charge transfer signal TX_ENA to active the charge transfer transistor 806A. The transferred photocharge is applied to the gate 808' to produce a signal voltage Vsig on the column output line 811. The sample and hold circuit 265, in response to the sample/hold pulse SHS, then samples the signal voltage Vsig onto a second capacitor and the differential amplifier 267 (FIG. 10) produces a differential signal (Vsig–Vrst). Finally, in preparing to capture a next image frame, the ROW_DRIVER signal is set low and the reset transistor 807 briefly turned on to reset the floating diffusion node 810. Again, as noted, the operation is subsequently repeated, for pixels 813-814, using charge transfer transistors 806B-C and corresponding charge transfer signals TX_ENB and TX_ENC.

Figure 9A:
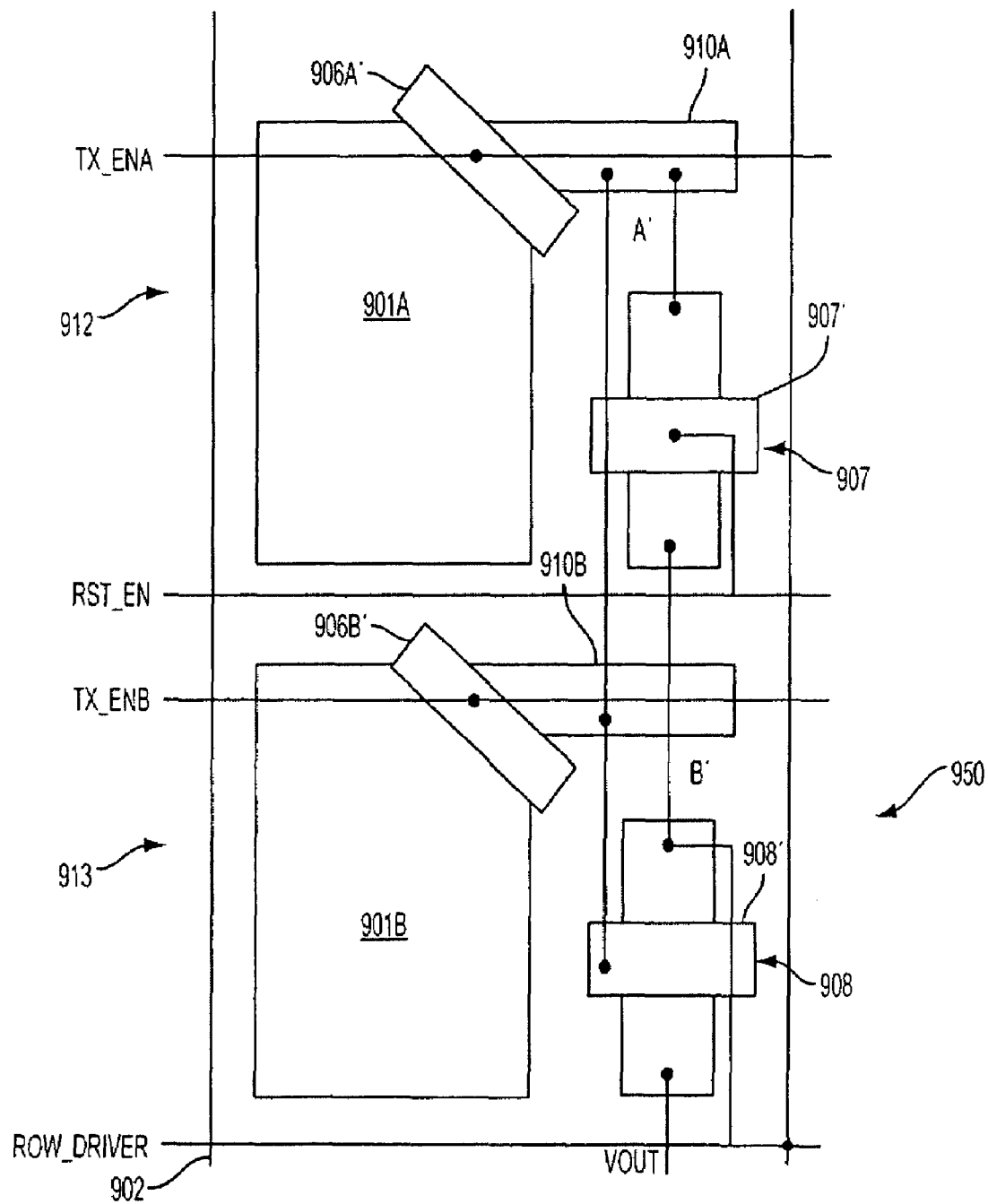
FIG. 9A is a top-down view layout of a portion of a fourth pixel array employing a shared pixel component architecture in accordance with a fourth embodiment described herein.
Figure 9B:
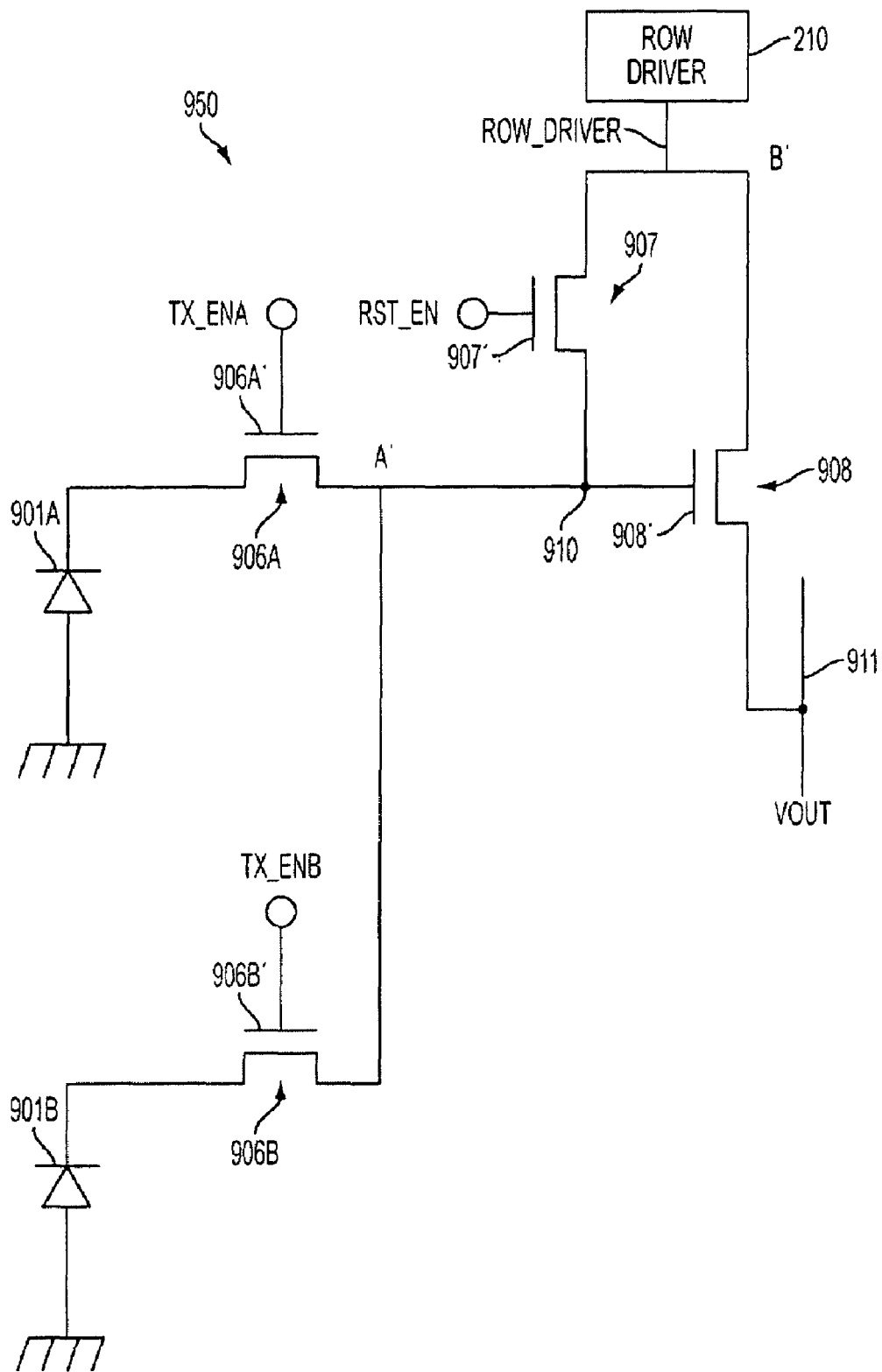
FIG. 9B is a circuit diagram of the FIG. 9A portion of the fourth pixel array.

FIGS. 9A-B respectively illustrate a top-down view layout and circuit diagram of a shared pixel component architecture in a fourth embodiment having pixels 912-913 of a fourth pixel group 950 of a pixel array. Each pixel 912-913 contains a respective photosensor 901A-B, respective charge transfer transistor 906A-B and gate 906A'-B', and a respective one of the floating diffusion regions 910A-B, which are commonly connected to form a floating diffusion node 910, and shared readout reset and source follower transistors 907-908 having respective gates 907'-908'.

As can be seen from a comparison of FIGS. 7A-B and 9A-B, the layouts and interconnections of the pixels 813-814 and 912-913, which similarly comprise respective reset transistors 807, 907 in pixels 813, 912 and respective source follower transistors 808, 908 in pixels 814, 913, are nearly identical with the sole exception being that in FIGS. 9A-B there are only two pixels sharing the reset 907 and source follower 908 transistors. The pixels 912-913 of the fourth pixel group 950 are operated in the same manner as the pixels 813-814 of the third pixel group 850. However, the operation of pixels 912-913 entails only the operating signals of "Pixel 1" and "Pixel 2", which respectively employ the transfer signals TX_ENA and TX_ENB of FIGS. 8A-B.

While a shared pixel component architecture provides a higher fill factor, by reducing the pixel area dedicated, in each pixel, to components other than the photosensors, a shared pixel component architecture can also increase the capacitance of the common floating diffusion node by increasing the number and aggregate size of the floating diffusion regions. An increase in the capacitance of the floating diffusion node, as a percentage of the respective capacitances of the photosensors, may result in a less linear conversion gain (i.e., volts per electron) which decreases the sensitivity of the pixels. Therefore, while having a lower fill factor than prior embodiments, the embodiment shown in FIGS. 9A-B may provide pixels with better sensitivity.

FIG. 10 illustrates a block diagram of a CMOS imager 300 having a pixel array 200 constructed in accordance with any of the embodiments described herein. Pixel array 200 comprises a plurality of pixels arranged in a predetermined number of columns and rows. Attached to the array 200 are analog and digital signal processing circuits. The pixels of each row in array 200 are all reset and read out at the same time by the row operating control signals described above, and the pixels of each column are selectively output by respective column select lines. A plurality of row and column lines are provided for the entire array 200. The row control signals are selectively activated by a row driver 210 in response to row address decoder 220. The column select lines are selectively activated by a column driver 260 in response to column address decoder 270. Thus, a row and column address is provided for each pixel.

The CMOS imager 300 is operated by the timing and control circuit 250, which controls address decoders 220, 270 for selecting the appropriate row and column lines for pixel readout. The control circuit 250 also controls the row and column driver circuitry 210, 260 such that these apply driving voltages to the drive transistors of the selected row and column lines. The pixel column signals for an activated readout row, which include the reset (Vrst) and signal voltages (Vsig) described above, are read onto respective capacitors of a sample and hold circuit 265, which is associated with the column driver 260 and which receives respective SHR and SHS sampling signals. A differential signal (Vrst–Vsig) is produced by differential amplifier 267 and may be further amplified if desired. Each pixel signal is then digitized by analog to digital converter 275 (ADC). The analog to digital converter 275 supplies the digitized pixel signals to an image processor 280 which processes the pixel signals and forms a digital image.

Figure 11:
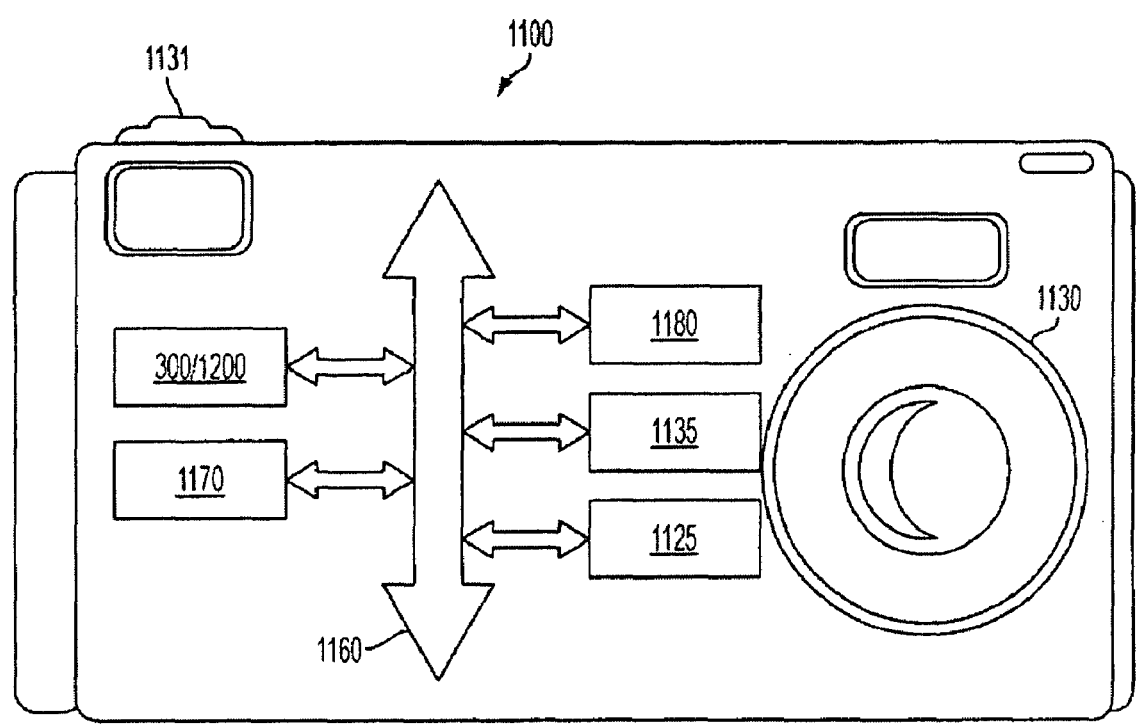
FIG. 11 is a circuit diagram of a processing system employing a CMOS imager constructed in accordance with one or more embodiments described herein.

FIG. 11 is a non-limiting example of a processor system 1100, constructed as a camera system, which may employ the disclosed embodiments. The processor system 1100, which is illustrated as a still or video camera system, generally comprises a lens 1130 for focusing an incoming image on a pixel array 200 to capture an image when a shutter release button 1131 is pressed. Also provided is the imager device 300 (FIG. 10), which may communicate over a bus 1160 with one or more input/output (I/O) devices 1170 and a CPU 1180 for controlling the imager system 1100, e.g., camera functions. The system 1100 may include random access memory (RAM) 1125. Removable memory 1135, such as for instance flash memory, may also be provided as part of system 1100.

The processes and devices described above are examples of methods and devices which could be used to implement the disclosed embodiments. While the above description and drawings illustrate several embodiments, it is not intended that the present invention be strictly limited to the above-described and illustrated embodiments. For example, although the invention is discussed only with reference to pixel arrays having a 2-way, 3-way, or 4-way sharing of component parts, other multi-way sharing pixel arrays are also intended to be within the scope of the invention. Also, the embodiments have been described using three (3T) and four (4T) transistor pixels, but the embodiments are not so limited as other pixel circuits having more than four transistors may be used, such as pixels using storage gates between the photosensor and transfer gate, and pixels using anti-blooming transistors or other arrangements, as but two examples. Additionally, any modifications, though presently unforeseeable, of the present invention that come within the spirit and scope of the following claims should be considered part of the present invention.

The invention claimed is:

1. A pixel array including a plurality of pixels arranged into a plurality of rows and columns, the array comprising:
a plurality of pixel groups, each comprising:
a common storage node for storing charge from a plurality of pixels;
first, second, and third pixels each having a respective photosensor for generating charge in response to received light and a respective charge transfer gate for transferring the generated charge to the common storage node;
a common reset transistor for resetting the amount of charge stored at the common storage node, the reset transistor being located within the first pixel;
a common source follower transistor for producing a pixel signal indicating the amount of charge stored by the common storage node, the source follower transistor being located within the second pixel; and
a common row select transistor for gating the pixel signal produced by the source follower transistor, the row select transistor being located within the third pixel, wherein spatial locations of the reset, source follower, and row select transistor gates respectively within the first, second, and third pixels are substantially the same.

2. The pixel array of claim 1, wherein top-down view layouts of the charge transfer gates have the same orientation with respect to axes of direction formed by the rows or columns.

3. The pixel array of claim 1, wherein the location of the reset transistor relative to the first photosensor is the same as the location of the source follower transistor relative to the second photosensor.

4. The pixel array of claim 1, further comprising:
a fourth pixel having a respective photosensor for generating charges in response to received light and a respective charge transfer transistor for transferring the generated charges to the common storage node; and
a dummy transistor gate located within the fourth pixel and configured to supply a ground signal to a substrate in which said pixel array is formed.

5. The pixel array of claim 4, wherein the top-down view layouts of the reset, source follower, row select, and dummy transistor gates have substantially the same orientation with reference to a row-wise or column-wise direction of the pixel array.

6. A pixel array including a plurality of pixels arranged into a plurality of rows and columns, the array comprising:
a plurality of pixel groups, each comprising:
a common storage node for storing charge from a plurality of pixels;
first, second, and third pixels each having a respective photosensor for generating charge in response to received light and a respective charge transfer gate for transferring the generated charge to the common storage node;
a common reset transistor for resetting the amount of charge stored at the common storage node, the reset transistor being located within the first pixel;
a common source follower transistor for producing a pixel signal indicating the amount of charge stored by the common storage node, the source follower transistor being located within the second pixel; and
a dummy transistor gate located within the third pixel, wherein reset, source follower, and dummy transistors are aligned and spaced at equidistant lengths in a pixel row direction.

7. The pixel array of claim 6, wherein the dummy transistor gate applies a ground potential to a substrate in which said pixel array is formed.

8. The pixel array of claim 6, wherein spatial locations of the reset, source follower, and dummy transistor gates respectively within the first, second, and third pixels are substantially the same.

9. A pixel array including a plurality of pixels arranged into a plurality of rows and columns, the array comprising:
a plurality of pixel groups, each comprising:
a common storage node for storing charge from a plurality of pixels;
first, second, and third pixels each having a respective photosensor for generating charge in response to received light and a respective charge transfer gate for transferring the generated charge to the common storage node;
a common reset transistor for resetting the amount of charge stored at the common storage node, the reset transistor being located within the first pixel;
a common source follower transistor for producing a pixel signal indicating the amount of charge stored by the common storage node, the source follower transistor being located within the second pixel; and
a common row select transistor for gating the pixel signal produced by the source follower transistor, the row select transistor being located within the third pixel, wherein the reset, source follower, and row select transistors are spaced at equidistant lengths in a row-wise or column-wise direction of the pixel array.

10. An imager device comprising:
a pixel array comprising:
a plurality of pixels, each pixel comprising a photosensor region for generating charge in response to received light;
a plurality of common storage regions for storing the charge generated by the photosensor regions of at least two pixels of the plurality of pixels;
a plurality of shared pixel components, each operatively connected to a respective common storage region, shared by each of the at least two pixels and located within a defined area of a first pixel of the plurality of pixels;
a plurality of second shared pixel components, each operatively connected to a respective common storage region and located within a second pixel of the plurality of pixels; and
a plurality of third shared pixel components, each operatively connected to a respective common storage region and located within a third pixel of the plurality of pixels, wherein each respective first, second and third shared pixel components are aligned and have equidistant spacing in at least one of a row-wise and column-wise direction of the pixel array.

11. The imager device of claim 10, wherein at least one of the plurality of first shared pixel components comprises a transistor for resetting an amount of charge stored by the respective common storage region.

12. The imager device of claim 10, wherein at least one of the plurality of first shared pixel components comprises a transistor for producing a signal indicating an amount of charge stored by the respective common storage region.

13. The imager device of claim 10, wherein at least one of the plurality of first shared pixel components comprises a transistor gate for gating a signal indicating an amount of charge stored by the respective common storage region.

14. The imager device of claim 10, wherein at least one of the plurality of the first shared pixel components and at least one of the plurality of second shared pixel components is, respectively, a common reset transistor for resetting an amount of charge stored by the respective common storage region and a common source follower transistor for producing a pixel signal indicating the amount of charge stored by the respective common storage region.

15. The imager device of claim 10, wherein at least one of the plurality of first shared pixel components is a dummy transistor gate for grounding a semiconductor substrate region of the pixel array.

16. The imager device of claim 10, wherein the pixel array further comprises:
   a plurality of charge transfer transistors, each respectively provided in a pixel of the plurality of pixels, each charge transfer transistor configured to transfer the generated charge to the respective common storage node,
   wherein top-down view layouts of respective gates of the plurality of charge transfer transistors show that the gates have substantially the same orientation with respect to a row-wise or column-wise direction of the pixel array.

17. The imager device of claim 10, wherein each of the first and second shared pixel components are transistors, and top-down view layouts of respective gates of each of the first and second pixel components show that the gates have substantially the same orientation with respect to a row-wise or column-wise direction of the pixel array.

* * * * *